US008921872B2

(12) United States Patent
Ichikawa et al.

(10) Patent No.: US 8,921,872 B2
(45) Date of Patent: Dec. 30, 2014

(54) DISPLAY UNIT AND METHOD OF MANUFACTURING THE SAME, ELECTRONIC APPARATUS, ILLUMINATION UNIT, AND LIGHT-EMITTING DEVICE AND METHOD OF MANUFACTURING THE SAME

(71) Applicant: Sony Corporation, Tokyo (JP)

(72) Inventors: Tatsuya Ichikawa, Aichi (JP); Tadashi Ishibashi, Kanagawa (JP); Taichi Natori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/678,654

(22) Filed: Nov. 16, 2012

(65) Prior Publication Data

US 2013/0146903 A1 Jun. 13, 2013

(30) Foreign Application Priority Data

Dec. 9, 2011 (JP) ................... 2011-269990
Dec. 28, 2011 (JP) ................... 2011-288285

(51) Int. Cl.
*H01L 29/18* (2006.01)
*H01L 33/00* (2010.01)
*H01L 33/50* (2010.01)
*H01L 33/08* (2010.01)
*H01L 27/32* (2006.01)

(52) U.S. Cl.
CPC ............... *H01L 33/50* (2013.01); *H01L 33/08* (2013.01); *H01L 33/005* (2013.01); *H01L 27/322* (2013.01); *H01L 27/3246* (2013.01)
USPC ...................................................... 257/88

(58) Field of Classification Search
USPC ............... 257/13, 74–103, 40, 642–643, 759, 257/E51.001–E51.052, E25.008–E25.009, 257/E39.007, E27.117–E27.119, 116, 117, 257/432–437, 749, E33.056–E33.059, 257/E25.032, 186, E29.069–E29.071, 257/E29.245, E49.001–E49.004, E21.404; 438/29

See application file for complete search history.

(56) References Cited

U.S. PATENT DOCUMENTS

| 7,497,581 | B2 * | 3/2009 | Beeson et al. ................... 362/84 |
| 8,251,528 | B2 * | 8/2012 | Kim et al. ........................ 362/84 |
| 8,294,162 | B2 * | 10/2012 | Nakajima ........................ 257/88 |
| 2004/0217364 | A1 * | 11/2004 | Tarsa et al. ...................... 257/89 |
| 2004/0239240 | A1 * | 12/2004 | Kato .............................. 313/506 |
| 2005/0017255 | A1 * | 1/2005 | Yamazaki ........................ 257/84 |
| 2006/0022211 | A1 * | 2/2006 | Yatsuda et al. .................. 257/98 |
| 2007/0029539 | A1 * | 2/2007 | Yashima et al. ................. 257/13 |
| 2008/0057342 | A1 * | 3/2008 | Sekiya .......................... 428/690 |
| 2010/0014281 | A1 * | 1/2010 | Kim ............................ 362/97.2 |

FOREIGN PATENT DOCUMENTS

| JP | 03-152897 | 6/1991 |
| JP | 2008-041361 | 2/2008 |
| JP | 2008-053229 | 3/2008 |
| JP | 2011-076769 | 4/2011 |

* cited by examiner

*Primary Examiner* — Dao H Nguyen
*Assistant Examiner* — Tram H Nguyen
(74) *Attorney, Agent, or Firm* — Rader, Fishman & Grauer PLLC

(57) ABSTRACT

A display unit includes: a plurality of light-emitting devices; and a separation section disposed between any adjacent two of the plurality of light-emitting devices and including a photoexcited material. A light-emitting device includes: an excitation light source; a wavelength conversion layer converting excitation light emitted from the excitation light source into light of a wavelength different from a wavelength of the excitation light; and a wavelength selection film disposed on a surface farther from the excitation light source of the wavelength conversion layer.

19 Claims, 24 Drawing Sheets

DISPLAY UNIT AND METHOD OF MANUFACTURING THE SAME, ELECTRONIC APPARATUS, ILLUMINATION UNIT, AND LIGHT-EMITTING DEVICE AND METHOD OF MANUFACTURING THE SAME

BACKGROUND

The present disclosure relates to a display unit including, for example, a self-luminous device such as an organic EL (electroluminescence) device and a method of manufacturing the same, an electronic apparatus, and an illumination unit. Moreover, the present disclosure relates to a light-emitting device using wavelength-converted excitation light and a method of manufacturing the same.

High-performance display devices are desired along with acceleration of development of information and communication industry. For example, organic EL (electroluminescence) devices are self-luminous type display devices, and are superior in viewing angle width, contrast, and response speed (for example, refer to Japanese Unexamined Patent Application Publication No. 2008-53229). Such self-luminous type devices are individually separated by a separation film made of an insulating material.

In recent years, displays using organic EL devices as light-emitting devices for wide color gamut flat panel displays are attracting attention.

Typical methods of colorizing organic EL devices include a method of arranging, on a plane, light-emitting layers emitting three primary colors, i.e., red, green, and blue, and a method of dividing light into three primary colors through arranging, on a plane, color filters above a light-emitting layer emitting white. In the former method, typically, the light-emitting layers are formed by vacuum deposition; however, to arrange light-emitting layers of three primary colors on the plane, it is necessary to separately form the light-emitting layers of three primary colors with use of a metal mask. Accordingly, there is an issue that it is difficult to reduce a pixel size and to increase a pixel area. In the latter method, since it is not necessary to separately form the light-emitting layers, a reduction in pixel size and an increase in pixel area are easily achieved. However, emission spectra of three primary colors are determined by optical spectra of color filters. Color filters using a typical dye have a broad transmission wavelength, and cause not some little absorption in a maximum transmission wavelength region. Therefore, there are issues that a reproduced color gamut declines, and that luminance declines due to loss of emitted light.

On the other hand, for example, Japanese Unexamined Patent Application Publication No. H3-152897 discloses a method of obtaining three primary colors through using a combination of a light-emitting layer emitting blue light or ultraviolet light used as an excitation light source and a wavelength conversion layer using a fluorescent material or the like. In this method, only a light-emitting layer of a single color is necessary, and it is not necessary to separately form light-emitting layers of three primary colors; therefore, a reduction in pixel size and an increase in pixel area are achievable. Moreover, since any fluorescent material is freely selected as the material of the wavelength conversion layer, design of an optimum color reproduction range and an improvement in light emission efficiency are achievable. However, there is an issue that, in the case where it is difficult for the wavelength conversion layer to sufficiently absorb excitation light, the excitation light passes through the wavelength conversion layer to be mixed with light whose wavelength is converted into a fluorescence wavelength by the wavelength conversion layer, thereby causing a decline in color purity.

To solve this issue, for example, Japanese Unexamined Patent Application Publication No. 2008-41361 discloses a color-light-emitting device having a configuration using a color filter which allows fluorescent light to pass therethrough and block light other than the fluorescent light. Moreover, Japanese Unexamined Patent Application Publication No. 2011-76769 discloses an organic EL device having a configuration adapting a technique of producing optical resonance through adjusting positions of a light-emitting layer and a reflection layer, depending on an emission wavelength.

SUMMARY

However, light emitted from a light-emitting device travels toward all directions including not only a direction toward a display plane (a vertical direction) but also a horizontal direction where a separation film is disposed. Therefore, there is an issue that light from a self-luminous device is not fully extracted as display light, thereby not obtaining sufficient luminance. A similar issue occurs in an illumination unit using a self-luminous device.

Moreover, in a configuration in Japanese Unexamined Patent Application Publication No. 2008-41361, there is an issue that, while a wide color gamut using fluorescent light emission is maintained, luminance declines due to light absorption by a color filter. Further, in a configuration in Japanese Unexamined Patent Application Publication No. 2011-76769, there is an issue that, while color purity and luminance of emitted light are improved, it is necessary to strictly specify optical characteristics and positions of respective layers, depending on an emission wavelength; therefore, flexibility of structural design is restricted. Furthermore, compared to excitation light having passed through, color purity is relatively increased through increasing fluorescence emission intensity by resonance; therefore, color mixture is not actually suppressed.

It is desirable to provide a display unit improving luminance with use of light traveling toward a separation film and a method of manufacturing the same, an electronic apparatus including the same, and an illumination unit.

Moreover, it is desirable to provide a light-emitting device capable of improving emission efficiency and luminance while maintaining high color purity and a method of manufacturing the same.

According to an embodiment of the disclosure, there is provided a display unit including: a plurality of light-emitting devices; and a separation section disposed between any adjacent two of the plurality of light-emitting devices and including a photoexcited material.

According to an embodiment of the disclosure, there is provided an electronic apparatus including a display unit, the display unit including: a plurality of light-emitting devices; and a separation section disposed between any adjacent two of the plurality of light-emitting devices and including a photoexcited material.

According to an embodiment of the disclosure, there is provided an illumination unit including: a plurality of light-emitting devices; and a separation section disposed between any adjacent two of the plurality of light-emitting devices and including a photoexcited material.

In the display unit, the electronic apparatus, and the illumination unit according to the embodiments of the disclosure, the photoexcited material included in the separation section emits light by light traveling toward the separation section of light from the light-emitting devices, and then this light is extracted.

According to an embodiment of the disclosure, there is provided a method of manufacturing a display unit, the method including forming a separation section between any adjacent two of a plurality of light-emitting devices, the separation section being formed through including a photoexcited material.

According to an embodiment of the disclosure, there is provided a light-emitting device including: an excitation light source; a wavelength conversion layer converting excitation light emitted from the excitation light source into light of a wavelength different from a wavelength of the excitation light; and a wavelength selection film disposed on a surface farther from the excitation light source of the wavelength conversion layer.

According to an embodiment of the disclosure, there is provided a method of manufacturing a light-emitting device, the method including: forming an excitation light source; forming, on the excitation light source, a wavelength conversion layer converting excitation light emitted from the excitation light source into light of a wavelength different from a wavelength of the excitation light; and forming a wavelength selection film on a surface farther from the excitation light source of the wavelength conversion layer.

In the light-emitting device and the method of manufacturing the same according to the embodiments of the disclosure, leakage of excitation light not converted in the wavelength conversion layer to outside is suppressed by the first wavelength selection film disposed on the surface farther from the excitation light source of the wavelength conversion layer, and the excitation light is allowed to enter the wavelength conversion layer again.

In the display unit and the method of manufacturing the same, the electronic apparatus, and the illumination unit according to the embodiments of the disclosure, the separation section includes the photoexcited material; therefore, display light or illumination light is extracted with use of light traveling toward the separation section. Accordingly, an improvement in luminance is achievable.

Moreover, in the light-emitting device and the method of manufacturing the same according to the embodiments of the disclosure, the first wavelength selection film is disposed on the surface farther from the excitation light source of the wavelength conversion layer; therefore, leakage of unconverted excitation light to outside is suppressed. Therefore, color mixture due to mixture of light of different wavelengths is suppressed to improve color purity. Further, the unconverted excitation light is allowed to enter the wavelength conversion layer again; therefore, improvements in use efficiency of the excitation light and light emission efficiency are achievable.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIGS. 26A and 26B are a front view and a side view in a state in which Application Example 5 is opened, respectively, and FIGS. 26C, 26D, 26E, 26F, and 26G are a front view, a left side view, a right side view, a top view, and a bottom view in a state in which Application Example 5 is closed, respectively.

FIG. 27 is a perspective view illustrating an appearance of an example of an illumination unit including the organic light-emitting device and a separation film according to any one of the above-described embodiments and the like.

DETAILED DESCRIPTION

Preferred embodiments of the disclosure will be described in detail below referring to the accompanying drawings. It is to be noted that description will be given in the following order.

1. First Embodiment (An example in which all light-emitting devices emit light of a same color)

2. Modification 1 (An example including light-emitting devices emitting light without allowing the light to pass through a color filter)

3. Modification 2 (An example having a plurality of kinds of photoexcited materials emitting different colors)

4. Modification 3 (An example in which light from the light-emitting device and light emitted from the photoexcited material are mixed together to produce color light other than white light)

5. Second Embodiment (An example in which adjacent light-emitting devices emit light of different colors)

6. Third Embodiment (A light-emitting device including a wavelength selection film on a surface farther from a light source of a wavelength conversion layer)

7. Modification 4

8. Fourth Embodiment (A light-emitting device including wavelength selection films on both facing surfaces of the wavelength conversion layer)

9. Modification 5

10. Application Examples

11. Examples (First Embodiment)

[Entire Configuration of Display Unit]

Figure 1:
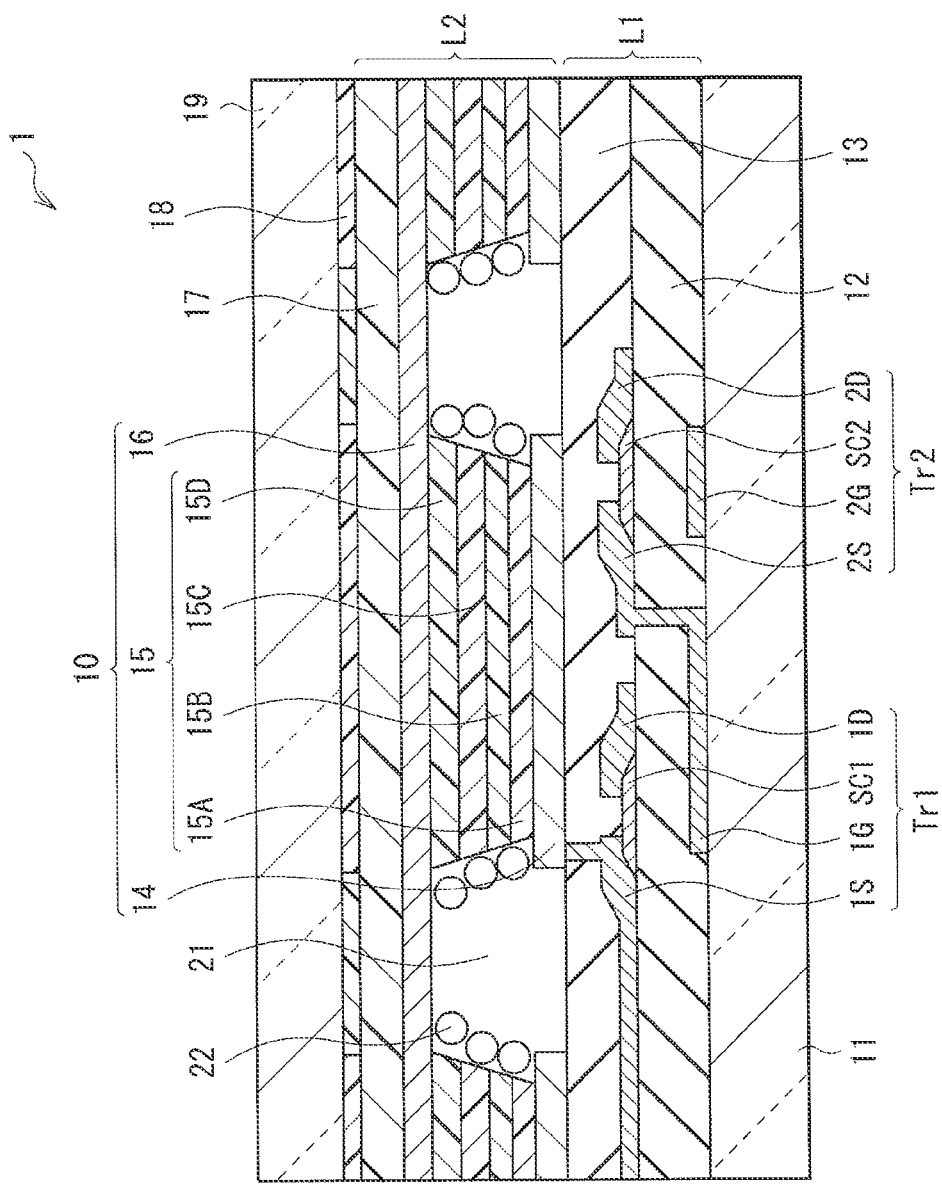
FIG. 1 is a sectional view illustrating a configuration of a display unit according to a first embodiment of the disclosure.
Figure 2:
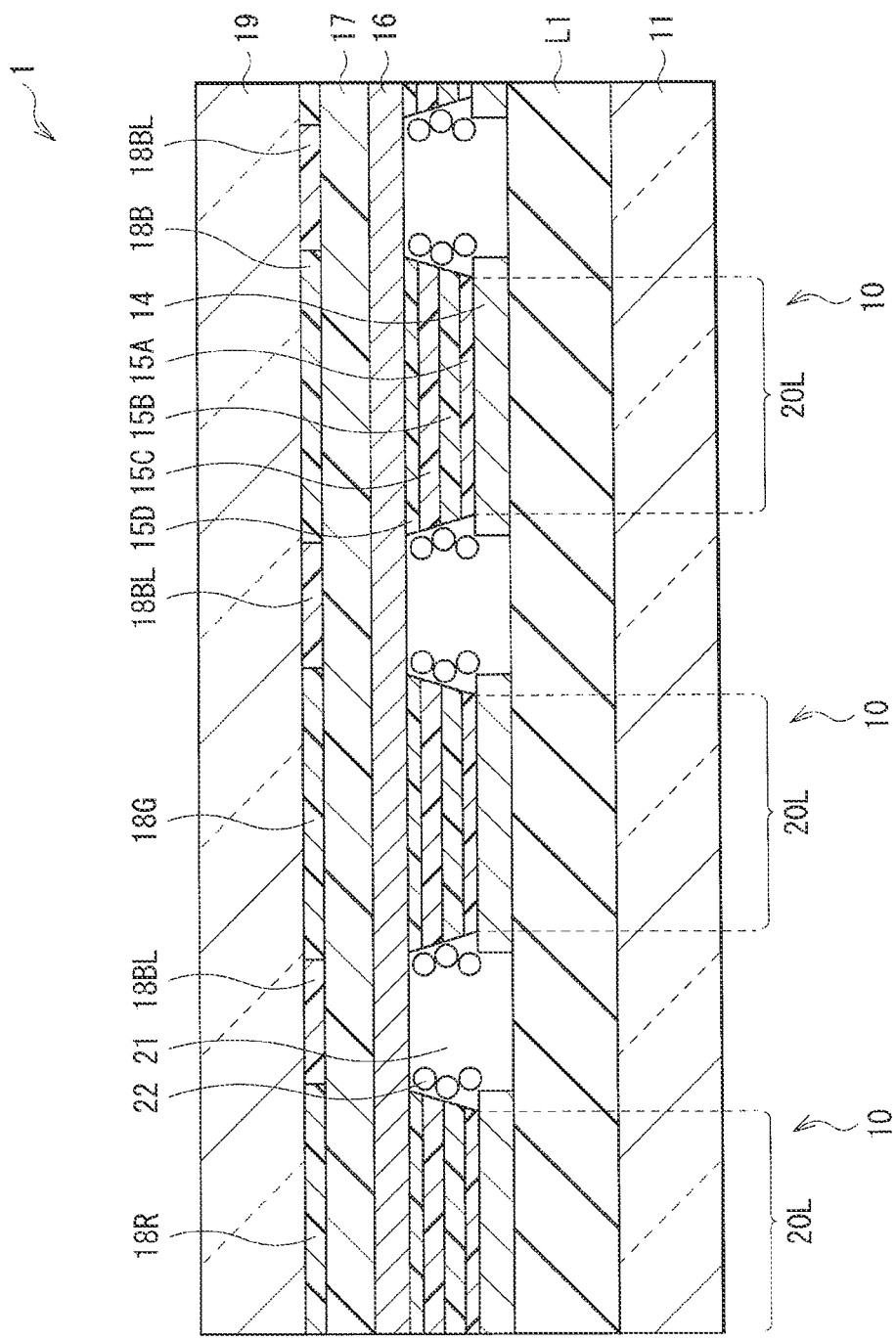
FIG. 2 is a sectional view illustrating a positional relationship between an organic light-emitting device and a color filter in the display unit illustrated in FIG. 1.

FIG. 1 illustrates a sectional configuration of a main part of a display unit (a display unit 1) according to a first embodiment of the disclosure. The display unit 1 is a self-luminous type display unit including a plurality of organic light-emitting devices 10 (light-emitting devices), and includes a pixel drive circuit formation layer L1, a light-emitting device formation layer L2 including the organic light-emitting devices 10, a color filter layer 18, and a counter substrate 19 in this order on a supporting substrate 11. A separation film 21 (a separation section) is disposed between any two adjacent organic light-emitting devices 10. As illustrated in FIG. 2, the separation film 21 determines the size and shape of a light emission region 20L of each of the organic light-emitting devices 10. The display unit 1 is a top emission type display unit in which light is extracted from the counter substrate 19, and the pixel drive circuit formation layer L1 includes, for example, a signal line drive circuit (a signal line drive circuit 120 in FIG. 3 which will be described later) and a scanning line drive circuit (a scanning line drive circuit 130 in FIG. 3 which will be described later) for image display. Respective components will be described in detail later.

Figure 3:
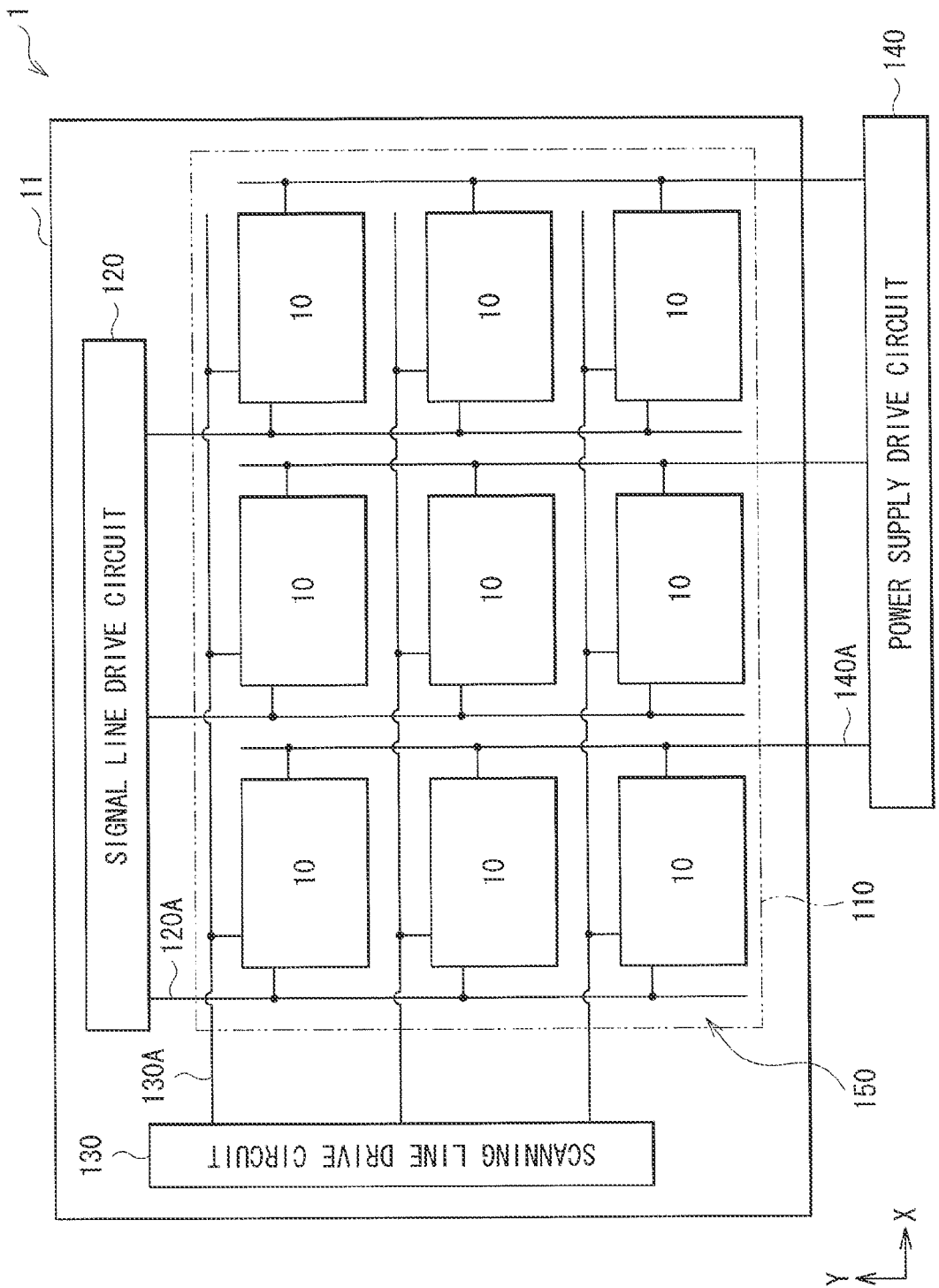
FIG. 3 is a schematic view illustrating an entire configuration of the display unit illustrated in FIG. 1.

FIG. 3 illustrates an entire configuration of the display unit 1. The display unit 1 has a display region 110 on the supporting substrate 11, and is used as an ultra-thin organic light-emitting color display unit or the like. For example, the signal line drive circuit 120, the scanning line drive circuit 130, and a power supply line drive circuit 140 as drivers for image display are disposed around the display region 110 on the supporting substrate 11.

A plurality of organic light-emitting devices 10 two-dimensionally arranged in a matrix and a pixel drive circuit 150 driving the organic light-emitting devices 10 are formed in the display region 110. In the pixel drive circuit 150, a plurality of signal lines 120A (120A1, 120A2, . . . , 120Am, . . . ) and a plurality of power supply lines 140A (140A1, . . . , 140An, . . . ) are arranged in a column direction (a Y direction), and a plurality of scanning lines 130A (130A1, . . . , 130An, . . . ) are arranged in a row direction (an X direction). Each of the organic light-emitting devices 10 is disposed corresponding to an intersection of each signal line 120A and each scanning line 130A. Both ends of each signal line 120A are connected to the signal line drive circuit 120, both ends of each scanning line 130A are connected to the scanning line drive circuit 130, and both ends of each power supply line 140A are connected to the power supply line drive circuit 140.

The signal line drive circuit 120 supplies a signal voltage of an image signal based on luminance information supplied from a signal supply source (not illustrated) to a selected organic light-emitting device 10 through the signal line 120A. The signal voltage from the signal line drive circuit 120 is applied to both ends of the signal line 120A.

The scanning line drive circuit 130 is configured of a shift register or the like which sequentially shifts (transmits) start pulses in synchronization with input clock pulses. When image signals are written to the organic light-emitting devices 10, the scanning line drive circuit 130 scans the image signals from one row to another to sequentially supply a scanning signal to each of the scanning lines 130A. The scanning signal from the scanning line drive circuit 130 is supplied to both ends of each scanning line 130A.

The power source line drive circuit 140 is configured of a shift register or the like which sequentially shifts (transmits) start pulses in synchronization with input clock pulses. The power source line drive circuit 140 appropriately supplies one of a first potential and a second potential which are different from each other to both ends of each power source line 140A in synchronization with scanning from one column to another by the signal line drive circuit 120. Thus, switching between a conduction state and a non-conduction state of a driving transistor Tr1 which will be described later is performed.

The pixel drive circuit 150 is disposed at a level between the substrate 11 and the organic light-emitting devices 10, i.e., in the pixel drive circuit formation layer L1. The pixel drive circuit 150 is an active drive circuit including the driving transistor Tr1 and a writing transistor Tr2 (refer to FIG. 1), a capacitor (retention capacitor) between the driving transistor Tr1 and the writing transistor Tr2, and the organic light-emitting devices 10. Each of the organic light-emitting devices 10 is connected to the driving transistor Tr1 in series between the power source line 140A and a common power source line (GND). The driving transistor Tr1 and the writing transistor Tr2 each are configured of a typical thin film transistor (TFT), and the TFT may have, for example, an inverted stagger configuration (a so-called bottom gate type) or a stagger configuration (a top gate type), and the configuration of the TFT is not specifically limited.

In the writing transistor Tr2, for example, a drain electrode 2D is connected to the signal line 120A to allow an image signal from the signal line drive circuit 120 to be supplied thereto. Moreover, a gate electrode 2G of the writing transistor Tr2 is connected to the scanning line 130A to allow a scanning signal from the scanning line drive circuit 130 to be supplied thereto. Further, a source electrode 2S of the writing transistor Tr2 is connected to a gate electrode 1G of the driving transistor Tr1. In the driving transistor Tr1, for example, a drain electrode 1D is connected to the power supply line 140A, and the driving transistor Tr1 is maintained at one of the first potential and the second potential by the power source line drive circuit 140. A source electrode 1S of the driving transistor Tr1 is connected to the organic light-emitting device 10. The retention capacitor is formed between the gate electrode 1G of the driving transistor Tr1 (the source electrode 2S of the wiring transistor Tr2) and the drain electrode 1D of the driving transistor Tr1.

[Configuration of Main Part of Display Unit]

Next, referring again to FIGS. 1 and 2, specific configurations of the supporting substrate 11, the pixel drive circuit formation layer L1, the light-emitting device formation layer L2, the counter substrate 19, and the like will be described below.

The supporting substrate 11 is formed of, for example, glass or a plastic material capable of blocking transmission of water (water vapor) and oxygen. In the top emission type, light is extracted from the counter substrate 19; therefore, the supporting substrate 11 may be formed of a transmissive material or a non-transmissive material. In the case where the display unit 1 is a flexible display, the supporting substrate 11 is preferably formed of a material with flexibility, for example, a plastic material.

The pixel drive circuit formation layer L1 has a laminate configuration including a gate insulating film 12 and a planarization layer 13 (refer to FIG. 1). In the pixel drive circuit formation layer L1, the driving transistor Tr1 and the writing transistor Tr2 configuring the pixel drive circuit 150 are formed, and the signal lines 120A, the scanning lines 130A, and the power supply lines 140A (all not illustrated) are buried in the pixel drive circuit formation layer L1. More specifically, the gate electrode 1G of the driving transistor Tr1 and the gate electrode 2G of the writing transistor Tr2 are formed on the supporting substrate 11, and are collectively covered with the gate insulating film 12. Semiconductor layers SC1 and SC2, the source electrodes 1S and 2S, and the drain electrodes 1D and 2D in the driving transistor Tr1 and the writing transistor Tr2 are formed on the gate insulating film 12.

The gate electrodes 1G and 2G each are formed of, for example, one or more kinds selected from metal materials, inorganic conductive materials, organic conductive materials, and carbon materials. Examples of the metal materials include aluminum (Al), copper (Cu), molybdenum (Mo), titanium (Ti), chromium (Cr), nickel (Ni), palladium (Pd), gold (Au), silver (Ag), platinum (Pt), and alloys thereof. Examples of the inorganic conductive materials include indium oxide ($In_2O_3$), indium tin oxide (ITO), indium zinc oxide (IZO), and zinc oxide (ZnO). Examples of the organic conductive materials include polyethylenedioxy thiophene (PEDOT) and polystyrene sulfonate (PSS). Examples of the carbon materials include graphite. It is to be noted that the gate electrodes 1G and 2G each may be configured of a laminate including two or more layers each formed of any of the above-described various materials.

The gate insulating film 12 is formed of, for example, one or more kinds selected from inorganic insulating materials and organic insulating materials. Examples of the inorganic materials include silicon oxide ($SiO_x$), silicon nitride ($SiN_x$), aluminum oxide ($Al_2O_3$), titanium oxide ($TiO_2$), hafnium oxide ($HfO_x$), and barium titanate ($BaTiO_3$). Examples of the organic insulating materials include polyvinyl phenol (PVP), polyimide, polymethacrylic acid acrylate, photosensitive polyimide, a photosensitive novolac resin, and polyparaxylylene. It is to be noted that the gate insulating film 12 may be configured of a laminate including two or more layers each formed of any of the above-described various materials.

The semiconductor layers SC1 and SC2 each are formed of one or more kinds selected from inorganic semiconductor materials and organic semiconductor materials. Examples of the inorganic semiconductor materials include amorphous silicon. Moreover, examples of the organic semiconductor materials include acenes and derivatives thereof. Examples of the acenes include naphthacene, pentacene, hexacene, heptacene, dibenzopentacene, tetrabenzopentacene, pyrene, dibenzopyrene, chrysene, perylene, coronene, terrylene, ovalene, quaterrylene, and circumanthracene.

The source electrodes 1S and 2S and the drain electrodes 1D and 2D each are formed of, for example, a material similar to that of the above-described gate electrodes 1G and 2G, and is preferably in ohmic contact with the semiconductor layers SC1 and SC2.

The planarization layer 13 is included to planarize mainly a surface of the pixel drive circuit formation layer L1, and is formed of, for example, an insulating resin material such as polyimide. If sufficient flatness is obtained by the gate insulating film 12, the planarization layer 13 may not be included.

The light-emitting device formation layer L2 includes the organic light-emitting devices 10 and the separation film 21, and the sealing layer 17 covering the organic light-emitting devices 10 and the separation film 21.

The organic light-emitting devices 10 each are configured of a laminate including a first electrode 14 as an anode electrode, an organic layer 15 (a functional layer) including a light-emitting layer 15C (which will be described later), and a second electrode 16 as a cathode electrode in this order from a side closer to the supporting substrate 11. The organic layer 15 includes a hole injection layer 15A, a hole transport layer 15B, the light-emitting layer 15C, and an electron transport layer 15D in this order from a side closer to the first electrode 14. However, the layers other than the light-emitting layer 15C may be included, if necessary. The organic layers 15 and the first electrodes 14 of the respective organic light-emitting devices 10 are individually separated by the separation film 21, and the second electrode 16 are disposed common to all of the organic light-emitting devices 10.

The first electrode 14 is an electrode injecting holes into the organic layer 15 (more specifically, the hole transport layer 15A), and is disposed on the planarization layer 13 in each of the organic light-emitting devices 10. The first electrode 14 has a reflection plane on a surface facing the organic layer 15, and reflects light emitted from the light-emitting layer 15C toward a display plane (toward the second electrode 16). Therefore, the first electrode 14 preferably has as high reflectivity as possible to increase light emission efficiency. The first electrode 14 is made of, for example, a simple substance or an alloy of silver (Ag), aluminum (Al), molybdenum (Mo), or chromium (Cr). Alternatively, the first electrode 14 may have a laminate configuration including the above-described metal and a transparent conductive film. As the material of the transparent conductive film, for example, an oxide of indium and tin (ITO), indium zinc oxide (InZnO), or an alloy of zinc oxide (ZnO) and aluminum (Al) is used.

Herein, the organic layers 15 in all of the organic light-emitting devices 10 are made of the same organic material as a constituent material, and a same color, for example, blue light (for example, a wavelength of approximately 435 to 480 nm) is emitted from all of the organic light-emitting devices 10. This light passes through the color filter layer 18 to be separated into different colors (for example, red, green, and blue) for respective sub-pixels as display light.

The hole injection layer 15A enhances hole injection efficiency, and is a buffer layer for preventing leakage. The hole injection layer 15A is made of, for example, 4,4',4"-tris(3-methylphenylphenylamino)triphenylamine (m-MTDATA) or 4,4',4"-tris(2-naphthylphenylamino)triphenylamine (2-TNATA).

The hole transport layer 15B enhances hole transport efficiency to the light-emitting layer 15C. The hole transport layer 15B is made of, for example, bis[(N-naphthyl)-N-phenyl]benzidine (α-NPD).

The light-emitting layer 15C emits light by the recombination of electrons and holes in response to the application of an electric field. The light-emitting layer 15C is made of, for example, a material prepared through mixing 2.5 wt % of 4,4'≡bis[2≡{4≡(N,≡diphenylamino)phenyl}vinyl]biphenyl (DPAVBi) into spiro6Φ or 9,10-di-(2-naphthyl)anthracene (ADN).

The electron transport layer 15D enhances electron transport efficiency to the light-emitting layer 15C. The electron transport layer 15D is made of, for example, 8-quinolinol aluminum complex (Alq3). An electron injection layer for enhancing electron injection efficiency may be included between the electron transport layer 15D and the second electrode 16. The electron injection layer is made of, for example, LiF or $Li_2O$.

The second electrode 16 insulated from the first electrode 14 is disposed common to the organic light-emitting devices 10 on the organic layer 15. The second electrode 16 is made of a light-transmissive transparent material, for example, indium tin oxide (ITO), zinc oxide (ZnO), alumina-doped zinc oxide (AZO), gallium-doped zinc oxide (GZO), indium zinc oxide (IZO), indium titanium oxide (ITiO), or indium tungsten oxide (IWO). Alternatively, an alloy or the like of aluminum (Al), magnesium (Mg), calcium (Ca), or sodium (Na) may be used.

The separation film 21 is disposed between the first electrode 14 and the second electrode 16, and secures insulation between them, and separates adjacent organic light-emitting devices 10 from each other. In other words, the organic light-emitting device 10 is disposed in a gap between any two adjacent separation films 21. In this embodiment, the separation film 21 includes a photoexcited material 22. As will be described in detail later, the photoexcited material 22 allows luminance to be improved with use of light which is not extracted from the display plane (the counter substrate 19) (from a vertical direction in a paper plane in FIGS. 1 and 2) and travels toward the separation film 21 (in a horizontal direction in the paper plane in FIGS. 1 and 2) of light emitted from the organic light-emitting device 10 (the light-emitting layer 15C).

Figure 4:
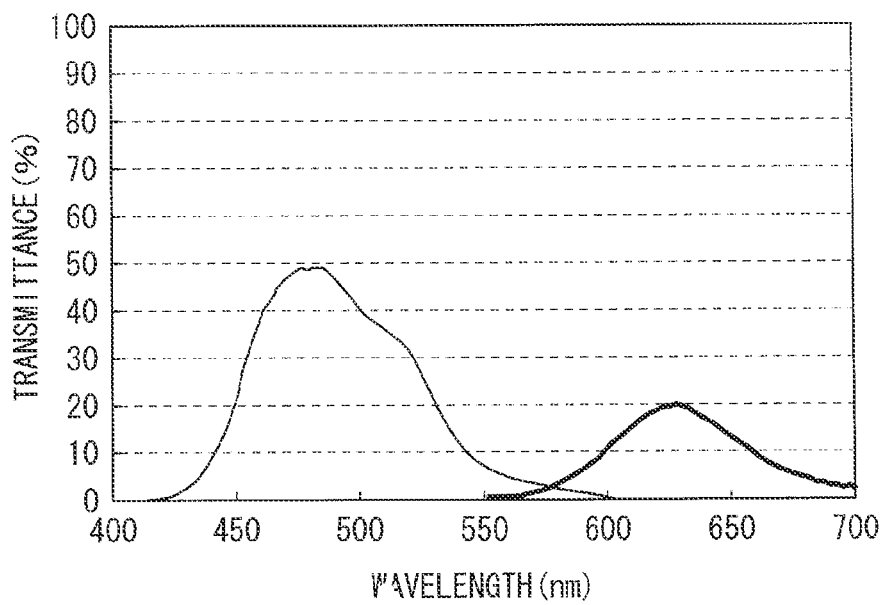
FIG. 4 is a diagram for describing light emission of a photoexcited material.

The separation film 21 has, for example, a tapered shape (a forward tapered shape), and is made of an insulating resin material such as polyimide which includes a plurality of photoexcited materials 22. Although the photoexcited materials 22 may be distributed throughout the separation film 21 uniformly enough to secure insulation, the photoexcited materials 22 are preferably included only in proximity to each organic light-emitting device 10 (a side surface of the separation film 21) to secure insulation between the organic light-emitting devices 10. As illustrated in FIG. 4, the photoexcited materials 22 are excited through absorbing light of a predetermined wavelength (around 480 nm in FIG. 4) emitted from the light-emitting layer 15C to emit light (of a wavelength around 620 nm in FIG. 4). In this case, blue light is emitted from the light-emitting layer 15C, and the photoexcited materials 22 are excited by this light to emit yellow light (for example, a wavelength of approximately 570 nm to 580 nm). In other words, light from the organic light-emitting devices 10 and light emitted from the photoexcited materials 22 are mixed together to produce white light.

The photoexcited materials 22 are, for example, particles with a diameter of approximately 1 nm to 100 nm. More specifically, the photoexcited materials 22 are quantum dots or the like. As the quantum dots, existing quantum dots may be used, and the quantum dots are made of, for example, a compound of a Group 12 element and a Group 16 element, a compound of a Group 13 element and a Group 16 element, or a compound of a Group 14 element and a Group 16 element, and has a core structure made of a compound of CdSe, CdTe, ZnS, CdS, PdS, PbSe, or CdHgTe, or a core-shell structure in which quantum dots made of a CdSe compound are covered with a ZnS compound or the like. The emission wavelength of the photoexcited materials 22 is adjustable, for example, through adjusting the size of the particles.

As in the case of the planarization layer 13, the sealing layer 17 is made of, for example, an insulating resin material such as polyimide.

The color filter layer 18 is disposed on a surface facing the supporting substrate 11 (the organic light-emitting devices 10) of the counter substrate 19. The color filter layer 18 includes red color filters 18R, green color filters 18G, and blue color filters 18B which are disposed in order to correspond to the respective organic light-emitting devices 10 (the respective light emission regions 20L) (refer to FIG. 2). The red color filters 18R, the green color filters 18G, and the blue color filters 18B each are made of a resin including a pigment, and each allow light in a wavelength range of a target color (for example, red, green, or blue) to selectively pass therethrough through selecting a pigment for the target color. In other words, white light produced through mixing light from the light-emitting layer 15C and light from the photoexcited material 22 together is converted, by the color filter layer 18, into red light, green light, or blue light for each of the light emission regions 20L (sub-pixels) of the organic light-emitting devices 10. A black matrix 18BL is disposed between any adjacent two of the red color filters 18R, the green color filters 18G, and the blue color filters 18B.

The counter substrate 19 seals the organic light-emitting devices 10 together with the sealing layer 17 and an adhesive layer (not illustrated) made of a thermosetting resin or the like, and is made of transparent glass or a transparent plastic material allowing light emitted from the light-emitting layer 15C included in the organic layer 15 to pass therethrough.

[Method of Manufacturing Display Unit]

The display unit 1 is manufactured by the following steps, for example.

First, the pixel drive circuit formation layer L1 and the first electrode 14 are formed on the supporting substrate 11. More specifically, first, a metal film made of the material of the gate electrodes 1G and 2G is formed on the supporting substrate 11 by, for example, an evaporation method. After that, the metal film is patterned by, for example, a photolithography method, dry etching, or wet etching to form the gate electrodes 1G and 2G and the signal lines 120A on the supporting substrate 11. Next, the gate insulating film 12 is formed with use of the above-described material by a spin coating method or the like to cover an entire surface of the supporting substrate 11. Next, the semiconductor layers SC1 and SC2, the drain electrodes 1D and 2D, and the source electrodes 1S and 2S are sequentially formed in predetermined shapes on the gate insulating film 12 by, for example, the evaporation method and the photolithography method. At this time, a connection section connecting the gate electrode 1G and the source electrode 2S to each other is formed in the gate insulating film 12 in advance. Moreover, the scanning lines 130A and the power supply lines 140A are formed together with the formation of the drain electrodes 1D and 2D and the source electrodes 1S and 2S. At this time, a connection section necessary to connect each line and each electrode to each other is appropriately formed. After that, the entire surface is covered with the planarization layer 13 by the spin coating method or the like (and, if necessary, a photolithography process is additionally performed) to complete the pixel drive circuit formation layer L1. At this time, a connection hole for forming a connection section to the first electrode 14 is formed by dry etching or the like at a predetermined position on the source electrode 1S in the planarization layer 13.

After the pixel drive circuit formation layer L1 is formed, the first electrode 14 made of the above-described predetermined material is formed. More specifically, a metal film made of the above-described material is formed on an entire surface of the pixel drive circuit formation layer L1 by, for example, the evaporation method or the like, and then, a resist pattern with a predetermined shape is formed on the metal film with use of a predetermined mask, and the metal film is selectively etched with use of the resist pattern as a mask. At this time, the first electrode 14 is formed to cover a surface of the planarization layer 13 and to fill the above-described connection hole.

After the first electrode 14 is formed, the separation film 21 including the photoexcited materials 22 are formed into a pattern. More specifically, an entire surface of the supporting substrate 11 (the planarization layer 13 and the first electrode 14) is coated with an insulating material including the photoexcited materials 22 by, for example, the spin coating method. After that, firing, selective exposure to light, and development are sequentially performed on the insulating material to pattern the separation film 21 in a predetermined shape.

To dispose the photoexcited materials 22 closer to each organic light-emitting device 10, the insulating material including the photoexcited materials 22 and an insulating material not including the photoexcited materials 22 may be separately patterned with use of a mask. Alternatively, after the insulating material including the photoexcited materials 22 is patterned into a predetermined shape, the insulating material may be baked to transfer the photoexcited materials 22 toward each organic light-emitting device 10, or after the insulating material and the photoexcited materials 22 are mixed in a solvent, and the supporting substrate 11 is coated with the solvent and then patterned, the photoexcited materials 22 may be transferred toward each organic light-emitting device 10 at the time of drying the solvent. The photoexcited materials 22 may be oriented with use of a surface active agent.

Next, the hole injection layer 15A, the hole transport layer 15B, the light-emitting layer 15C, and the electron transport layer 15D made of the above-described predetermined materials are laminated in order by, for example, the evaporation method to completely fill a gap between any two adjacent separation films 21, thereby forming the organic layer 15. Moreover, the second electrode 16 is formed on the entire surface by, for example, the evaporation method to face the first electrode 14 with the organic layer 15 in between. Thus, the organic light-emitting devices 10 are formed.

After the organic light-emitting devices 10 are formed, the sealing layer 17 is formed on the entire surface of the supporting substrate 11. Finally, the counter substrate 19 on which the color filter layer 18 is disposed is bonded onto the sealing layer 17 with an adhesive layer in between by, for example, a vacuum lamination method to complete the display unit 1.

[Operation of Display Unit]

In the display 1, a scanning signal is supplied from the scanning line drive circuit 130 to each organic light-emitting device 10 through the gate electrode 2G of the writing transistor Tr2, and an image signal supplied from the signal line drive circuit 120 through the writing transistor Tr2 is retained in the retention capacitor Cs. In other words, on-off control of the driving transistor Tr1 is performed in response to the signal retained in the retention capacitor Cs, and a drive current is thereby injected into each organic light-emitting device 10 to emit light by the recombination of holes and electrons. The light passes through the second electrode 16, the sealing layer 17, the color filter layer 18 (the red color filters 18R, the green color filters 18G, and the blue color filters 18B), and the counter substrate 19 to be extracted.

[Functions and Effects of Display Unit]

Figure 5:
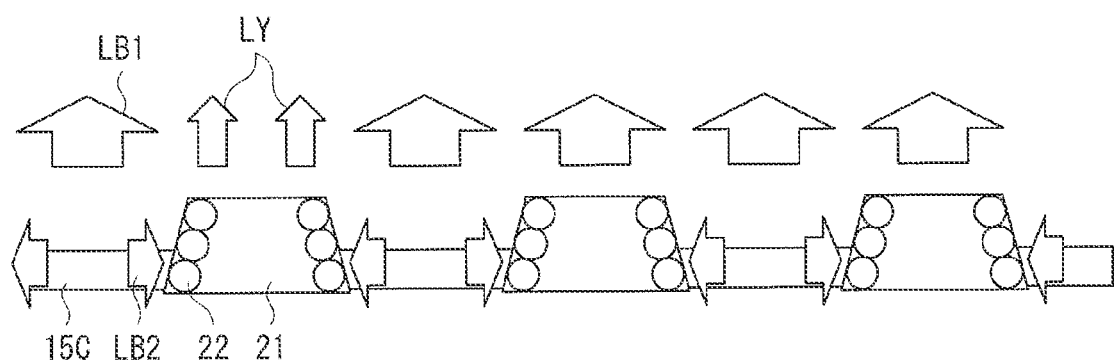
FIG. 5 is a schematic view for describing light emission of a light-emitting layer illustrated in FIG. 1 and the photoexcited material.

In this embodiment, since the photoexcited materials 22 are included in the separation film 21, as illustrated in FIG. 5, an improvement in luminance is achievable with use of light (blue light LB2) traveling from the light-emitting layer 15C toward the separation film 21 in addition to light (blue light LB1) emitted from the light-emitting layer 15C toward the display plane.

Figure 6:
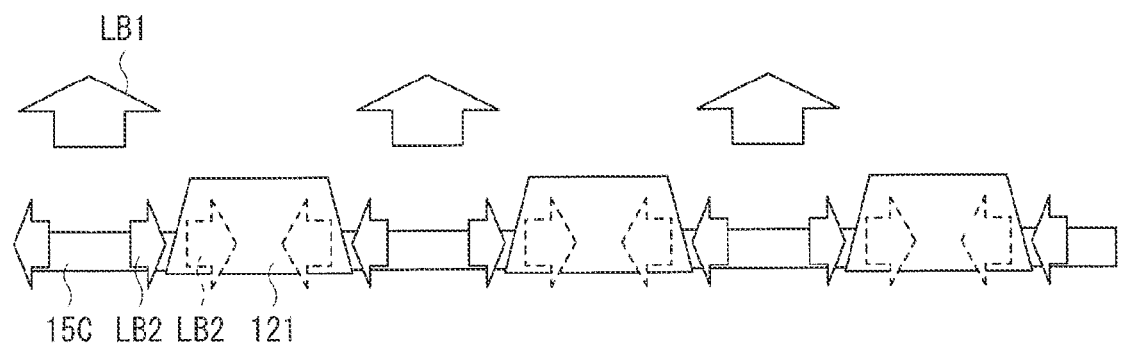
FIG. 6 is a schematic view for describing light extraction in a display unit in related art.

In related art, as illustrated in FIG. 6, the separation film 121 does not include the photoexcited material, and light (for example, the blue light LB2) traveling in a direction other than a direction toward the display plane is absorbed toward the supporting substrate 11 to be eliminated. For example, the light extraction efficiency of the organic light-emitting device 10 is approximately 20%, and approximately 80% of light is absorbed by the supporting substrate 11. Therefore, in the self-luminous type display unit, it is difficult to obtain sufficient luminance. Moreover, in the case where it is difficult to expand the light emission region by design, to increase luminance, it is necessary to increase a voltage applied to the organic light-emitting devices, and this may reduce luminance life (the lives of the organic light-emitting devices).

On the other hand, in the display unit 1, since the separation film 21 includes the photoexcited materials 22, the photoexcited materials 22 are excited by the blue light LB2 to emit yellow light LY (refer to FIG. 5). Therefore, the yellow light LY can be extracted in a direction parallel to the blue light LB1, that is, toward the display plane to improve luminance.

Moreover, since the photoexcited materials 22 are included in the separation film 21, light is emitted from a wider region than the light emission region 20L of the organic light-emitting device 10. In other words, even if the light emission region 20L (a gap between any two adjacent separation films 21) is narrow, luminance can be maintained and an increase in luminance life is achievable without increasing an applied current.

Further, when the organic layer includes the photoexcited materials, the organic layer may be degraded due to contamination of foreign substances to reduce luminance; however, in the display unit 1, the photoexcited materials 22 are included in the separation film 21; therefore, such a reduction in luminance is not caused.

Thus, in the embodiment, since the separation film 21 includes the photoexcited materials 22, an improvement in luminance is achievable with use of the blue light LB2 traveling toward the separation film 21.

Next, modifications of the present embodiment and other embodiments will be described below; however, in the following description, like components are denoted by like numerals as of the above-described embodiment and will not be further described.
(Modification 1)

Figure 7:
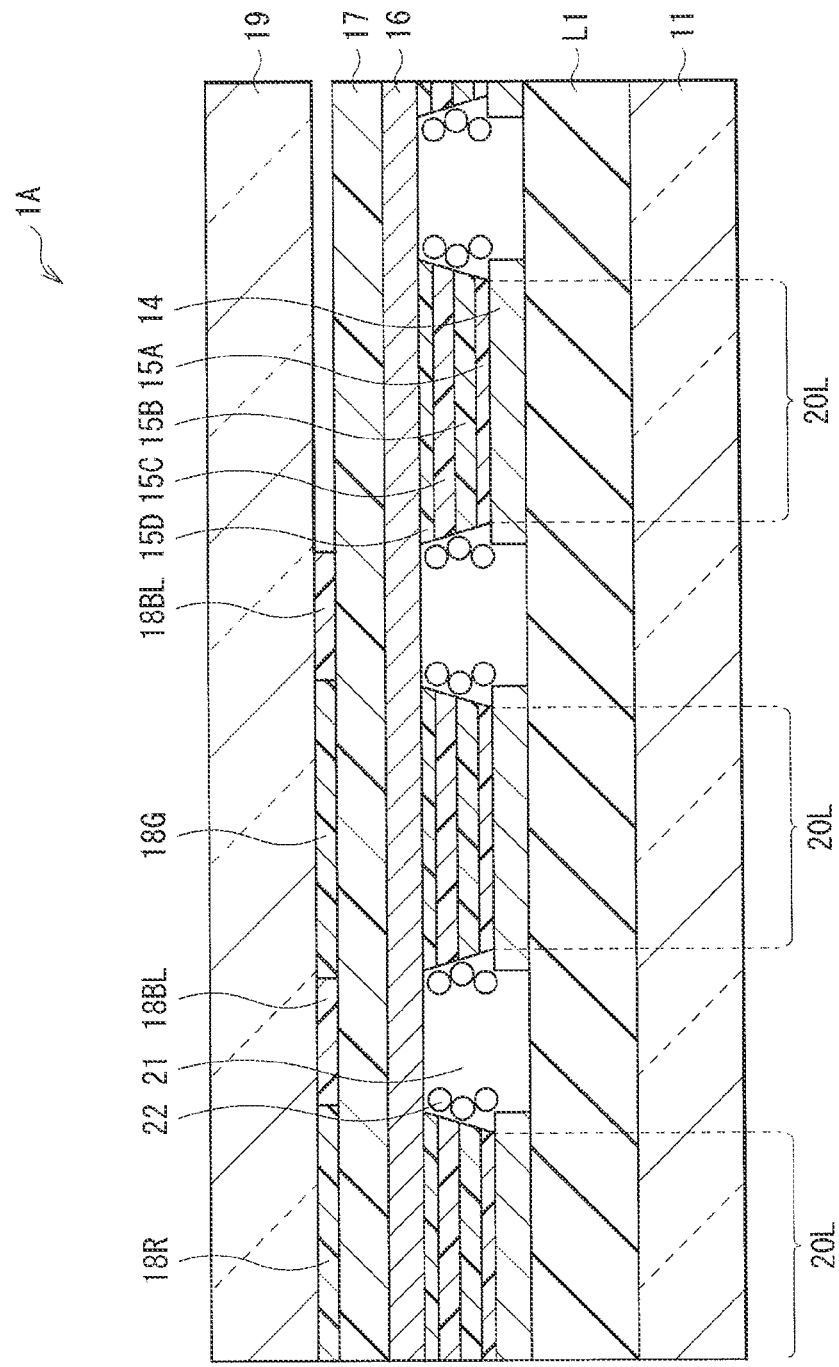
FIG. 7 is a sectional view illustrating a configuration of a display unit according to Modification 1.

FIG. 7 illustrates a sectional configuration of a display unit (a display unit 1A) according to Modification 1 of the above-described embodiment. The color filter layer 18 of the display unit 1A includes only the red color filters 18R and the green color filters 18G, and does not include blue color filters. The display unit 1A has a configuration similar to that of the display unit 1 according to the first embodiment, except for the above-described point, and functions and effects of the display unit 1A are similar to those of the display unit 1.

The color filter layer 18 includes the red color filters 18R, the green color filter 18G, and the black matrix 18BL between them; however, the color filter layer 18 (a blue color filter) is not disposed above (on a side closer to the display plane of) some of the light emission regions 20L. In other words, blue light emitted from the light emission region 20L is directly extracted without passing through the color filter layer 18. Thus, the color filter layer 18 may not be disposed in parts to use, as display light, light emitted from some of the light emission regions 20L (the light-emitting layer 15C) as it is.
(Modification 2)

Figure 8:
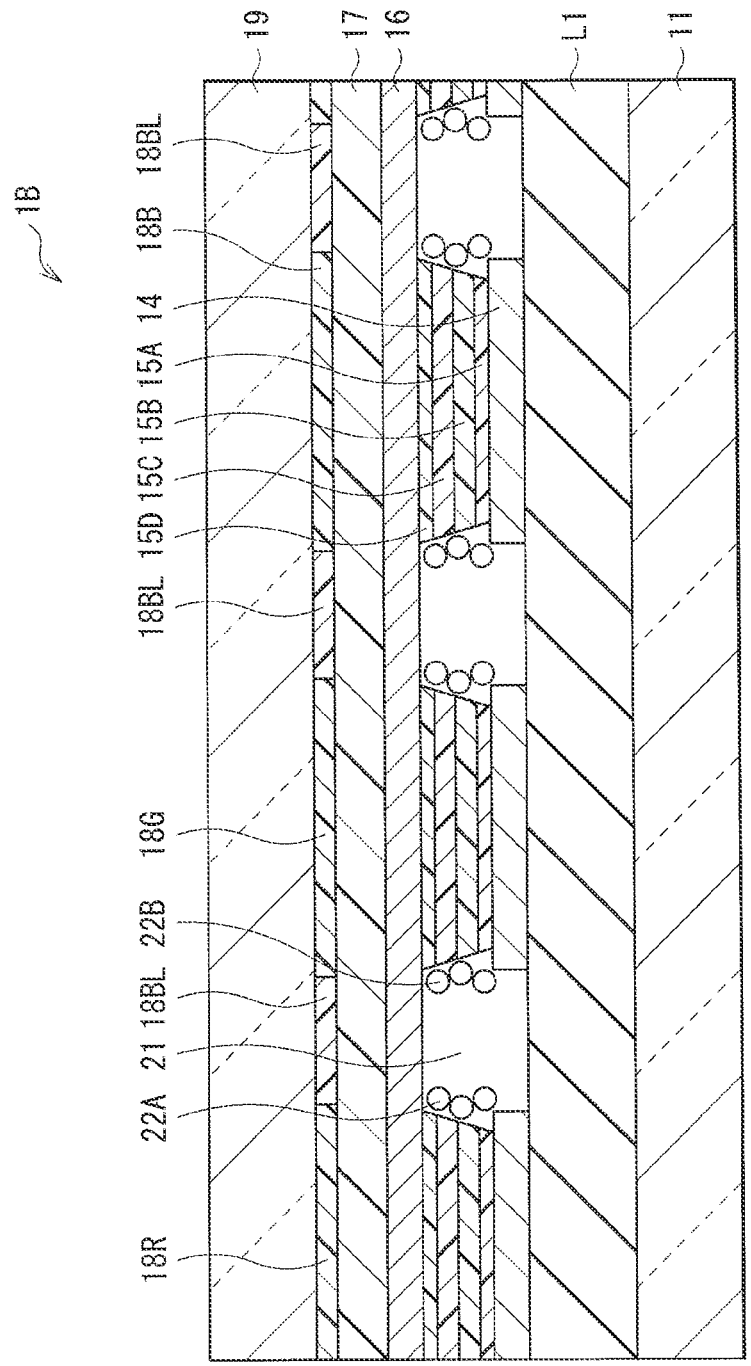
FIG. 8 is a sectional view illustrating a configuration of a display unit according to Modification 2.
Figure 9:
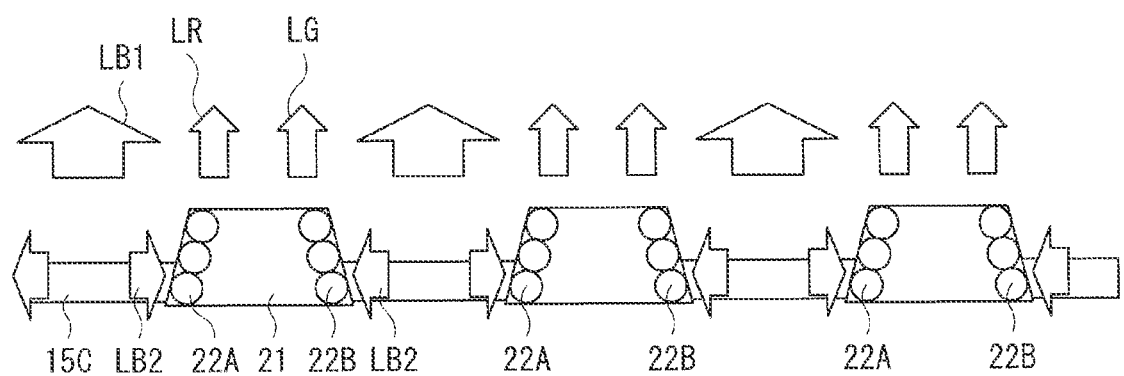
FIG. 9 is a schematic view for describing light emission of a light-emitting layer illustrated in FIG. 7 and the photoexcited material.

FIG. 8 illustrates a sectional configuration of a display unit (a display unit 1B) according to Modification 2 of the above-described embodiment. In the display unit 1B, photoexcited materials (photoexcited materials 22A and 22B) emitting light of different colors are included in proximity to one side surface and in proximity to the other side surface of the separation film 21, respectively. As illustrated in FIG. 9, the photoexcited materials 22A and 22B are excited by the blue light LB2 emitted from the light-emitting layer 15C to emit, for example, red light LR and green light LG, respectively. The red light LR and the green light LG are mixed with the blue light LB1 to produce white light. The display unit 1B has a configuration similar to that of the display unit 1 according to the first embodiment, except for the above-described point, and functions and effects of the display unit 1B are similar to those of the display unit 1.

The photoexcited material 22A is included in proximity to the one side surface (on the left side of the paper plane in FIGS. 8 and 9) of the separation film 21, and absorbs the blue light LB2 emitted from the light-emitting layer 15C to emit the red light LR. On the other hand, the photoexcited material 22B is included in proximity to the other side surface (on the right side of the paper plane in FIGS. 8 and 9) of the separation film 21, and absorbs the blue light LB2 emitted from the light-emitting layer 15C to emit the green light LG. The blue light LB1, the red light LR, and the green light LG are mixed together to produce white light, and the white light passes through the color filter layer 18 to be separated into light components for respective sub-pixels.
(Modification 3)

Figure 10:
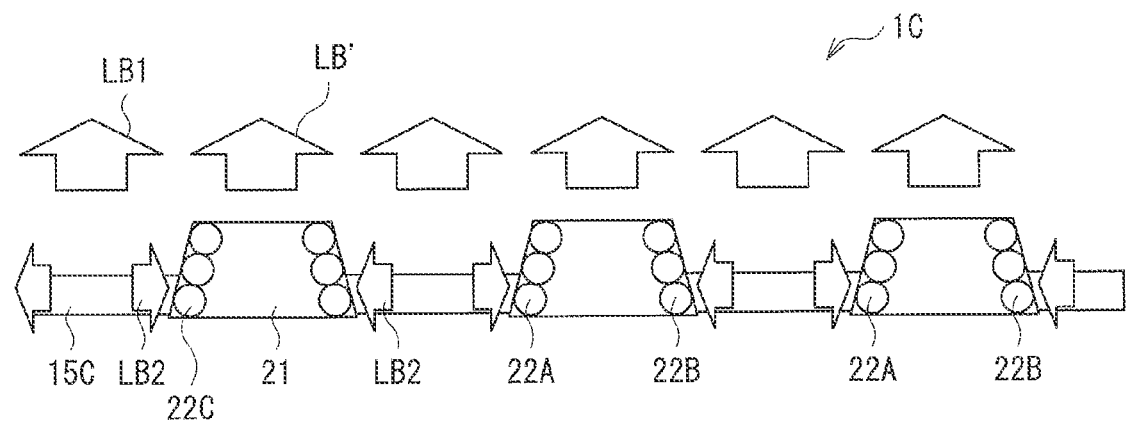
FIG. 10 is a schematic view for describing light emission of a light-emitting layer of a display unit according to Modification 3 and the photoexcited material.

FIG. 10 schematically illustrates a sectional configuration of a display unit (a display unit 1C) according to Modification 3 of the above-described embodiment. In the display unit 1C, light emitted from the light-emitting layer 15C and light emitted from a photoexcited material (a photoexcited material 22C) are mixed together to produce a color other than white. The display unit 1C has a configuration similar to that of the display unit 1 according to the first embodiment, except for the above-described point, and functions and effects of the display unit 1C are similar to those of the display unit 1.

The photoexcited material 22C is excited by, for example, the blue light LB2 emitted from the light-emitting layer 15C to emit blue-green (green-blue) light LB'. The blue-green light LB' is equivalent to, for example, the blue light LB2 (a wavelength of approximately 435 nm to 480 nm) shifted by approximately 5 nm to 50 nm toward a longer wavelength, that is, light of a wavelength of approximately 440 nm to 500 nm. Thus, in the display unit 1C, when the photoexcited material 22C emitting light of a desired wavelength is selected, the photoexcited material 22C is allowed to produce light with chromaticity which is difficult to be obtained only by the light-emitting layer 15C (the organic light-emitting device 10).

For example, green light (a wavelength of approximately 500 nm to 560 nm) and red light (a wavelength of approximately 610 nm to 750 nm) may be emitted from the light-emitting layer 15C and the photoexcited material 22C, respectively. It is preferable that the light-emitting layer 15C emit light of a shorter wavelength and the photoexcited material 22C emit light of a longer wavelength; however, the emission wavelengths of the light-emitting layer 15C and the photoexcited material 22C may be equal to each other.
(Second Embodiment)

Figure 11:
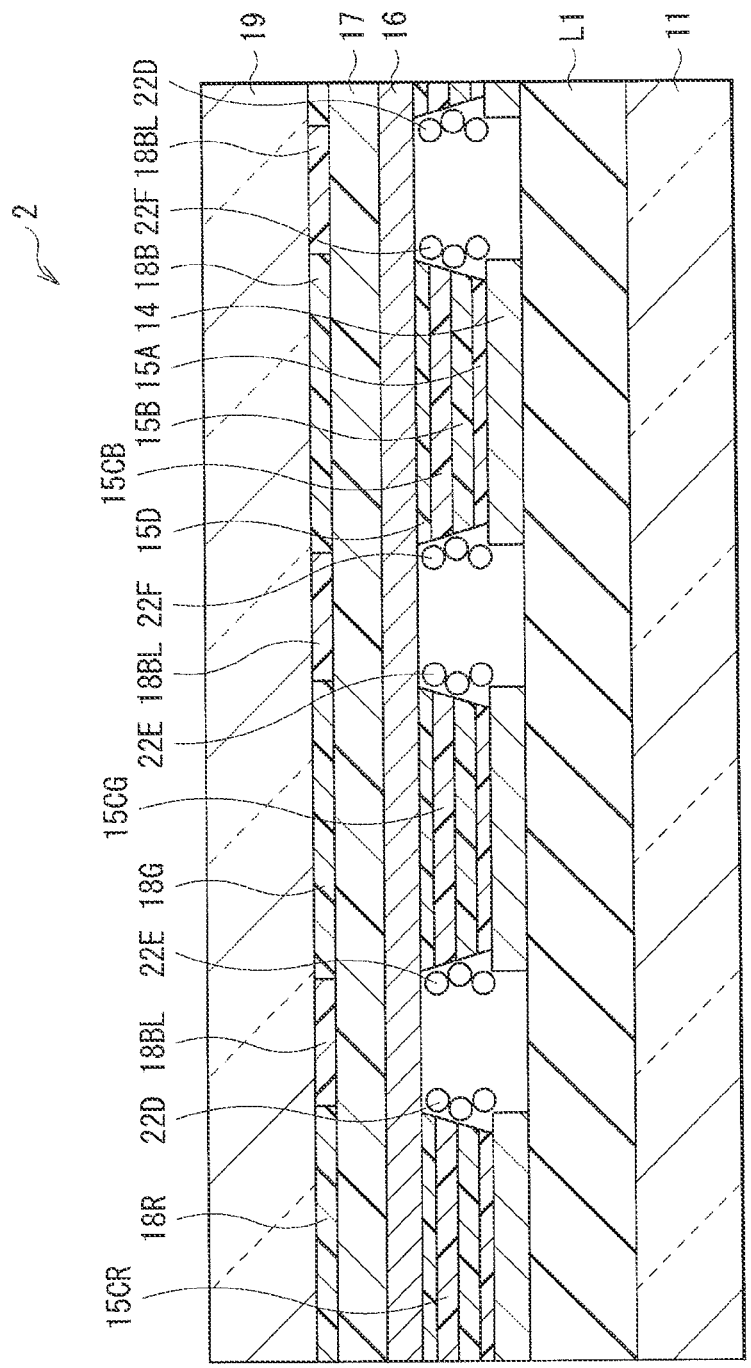
FIG. 11 is a sectional view illustrating a configuration of a display unit according to a second embodiment of the disclosure.

FIG. 11 illustrates a sectional configuration of a display unit (a display unit 2) according to a second embodiment of the disclosure. A light-emitting layer of the display unit 2 includes red light-emitting layers 15CR, green light-emitting layers 15CG, and blue light-emitting layers 15CB, and adjacent organic light-emitting devices 10 have different color light-emitting layers. The red light-emitting layers 15CR, the green light-emitting layers 15CG, and the blue light-emitting layers 15CB emit red light, green light, and blue light, respectively. In other words, in the display unit 2, adjacent organic light-emitting devices 10 emit different colors. The photoexcited material 22 includes photoexcited materials 22D, 22E, and 22F excited by the red light, the green light, and the blue light, respectively. The display unit 2 has a configuration similar to that of the display unit 1 according to the first embodiment, except for the above-described point, and functions and effects of the display unit 2 are similar to those of the display unit 1.

The red light-emitting layers 15CR, the green light-emitting layers 15CG, and the blue light-emitting layers 15CB are patterned for respective devices (respective sub-pixels) in such a manner that adjacent organic light-emitting devices 10 include different color light-emitting layers. The red color filter 18R, the green color filter layer 18G, and the blue color filter 18B are disposed to face each red light-emitting layer 15CR, each green light-emitting layer 15CG, and each blue light-emitting layer 15CB, respectively. The red light-emitting layer 15CR is made of Alq3 mixed with 40 vol % of 6-bis[4-[N-(4-methoxyphenyl)-N-phenyl]aminostyryl] naphthalene-1,5-dicarbonitrile (BSN-BCN). The green light-emitting layer 15CG is made of Alq3 mixed with 3 vol % of Coumarin6. The blue light-emitting layer 15CB is made of, for example, spiro6Φ.

One of the photoexcited materials 22D, 22E, and 22F is included in proximity to a side surface of the separation film 21, and the photoexcited material 22D is disposed on side surfaces facing each other of the separation film 21 with the red light-emitting layer 15CR in between, the photoexcited material 22E is disposed on side surfaces facing each other of the separation film 21 with the green light-emitting layer 15CG in between, and the photoexcited material 22F is disposed on side surfaces facing each other of the separation film 21 with the blue light-emitting layer 15CB in between. For example, the photoexcited material 22D, 22E, and 22F absorb red light, green light, and blue light to emit red light, green light, and blue light, respectively. The emission wavelengths of the photoexcited materials 22D, 22E, and 22F may be equal to those of the red light-emitting layer 15CR, the green light-emitting layer 15CG, and the blue light-emitting layer 15CB, respectively, or may be shifted from the red light-emitting layer 15CR, the green light-emitting layer 15CG, and the blue light-emitting layer 15CB, respectively, by approximately 5 nm to 50 nm toward a longer wavelength. Colors emitted from the photoexcited materials 22D, 22E, and 22F may be completely different from colors emitted from the red light-emitting layer 15CR, the green light-emitting layer 15CG, and the blue light-emitting layer 15CB, respectively. Thus, in addition to light emitted from the red light-emitting layer 15CR, the green light-emitting layer 15CG, and the blue light-emitting layer 15CB, light emitted from the photoexcited materials 22D, 22E, and 22F is also extracted as display light; therefore, an improvement in luminance is achievable, and optical design with high flexibility is possible. The photoexcited materials 22D, 22E, and 22F are arbitrarily arranged, and different kinds of photoexcited materials (for example, the photoexcited material 22D and the photoexcited material 22E) may be disposed on facing side surfaces of the red light-emitting layer 15CR, the green light-emitting layer 15CG, the blue light-emitting layer 15CB, respectively, or the same kind of photoexcited material (for example, the photoexcited material 22D) may be disposed in all of the separation films 21.

(Illumination Unit)

Figure 27:
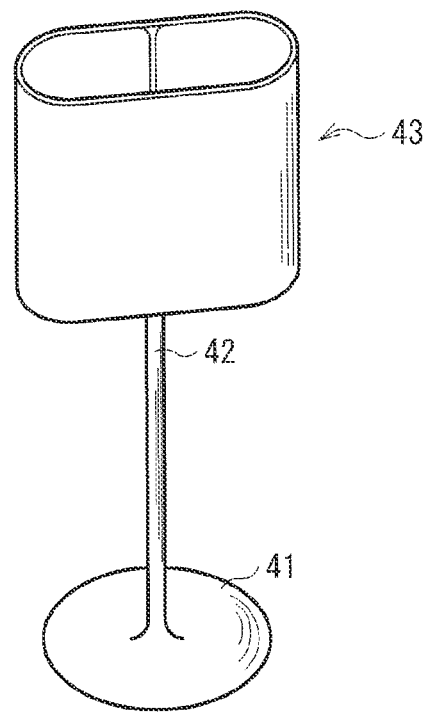
Figure 28:
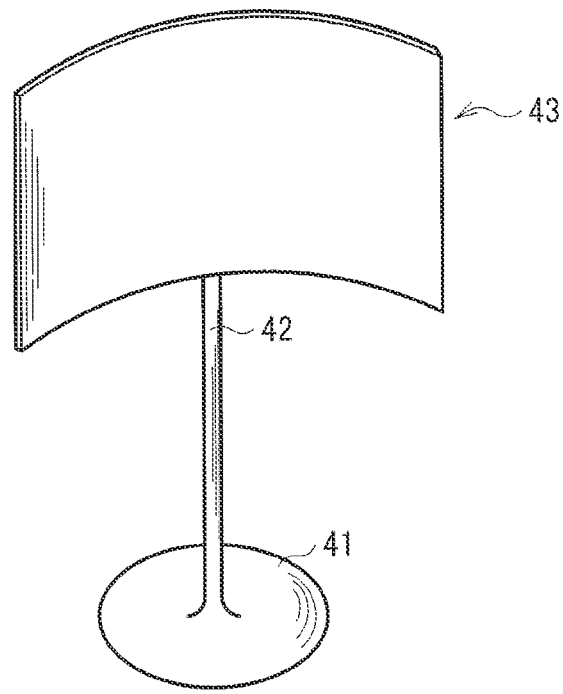
FIG. 28 is a perspective view illustrating an appearance of another example of the illumination unit.

An illumination unit may be configured of the organic light-emitting devices 10 and the separation films 21 in the above-described embodiments and the modifications thereof. FIGS. 27 and 28 illustrate appearances of a desk illumination unit configured through arranging a plurality of organic light-emitting devices 10 and a plurality of separation films 21. The illumination unit includes, for example, an illumination section 43 attached to a rod 42 disposed on a base 41, and the illumination section 43 is configured of the organic light-emitting devices 10 and the separation films 21 in any one of the above-described embodiments and the like. When the illumination section 43 uses a flexible substrate such as a resin substrate as the supporting substrate 11, the illumination section 43 may have an arbitrary shape such as a tubular shape illustrated in FIG. 27 or a curved shape illustrated in FIG. 28.

Figure 29:
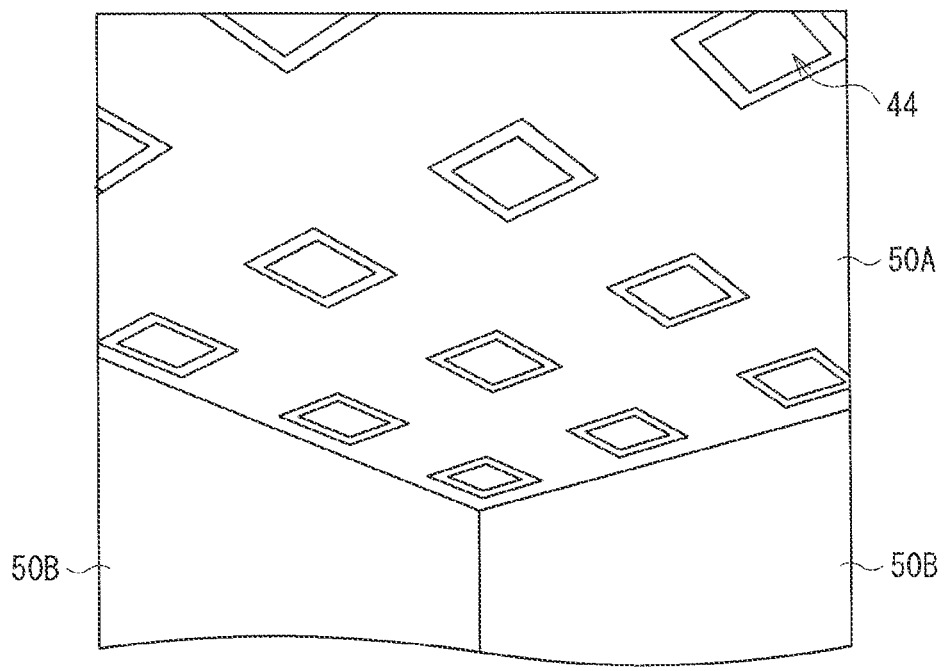
FIG. 29 is a perspective view illustrating an appearance of still another example of the illumination unit.

FIG. 29 illustrates an appearance of a room illumination unit using the organic light-emitting devices 10 and the separation films 21 in any one of the above-described embodiments and the like. The illumination unit includes, for example, an illumination section 44 configured of the organic light-emitting devices 10 and the separation films 21 in any of the above-described embodiments and the like. The desired number of the illumination sections 44 are arranged at desired intervals on a ceiling 50A of a building. It is to be noted that the illumination sections 44 may be disposed on an arbitrary place such as a wall 50B or a floor (not illustrated) in addition to the ceiling 50A, depending on the intended use.

(Third Embodiment)

[Basic Configuration]

Figure 12:
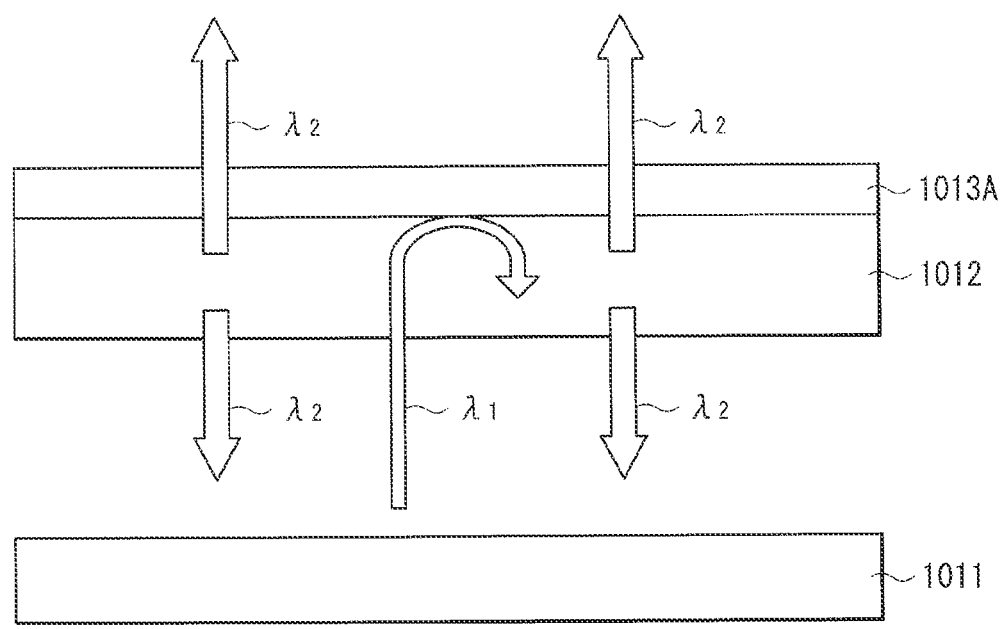
FIG. 12 is a schematic view illustrating a configuration of a light-emitting device according to a third embodiment of the disclosure.

FIG. 12 schematically illustrates a configuration of a light-emitting device 1010 according to a third embodiment of the disclosure. In the light-emitting device 1010, a wavelength conversion layer 1012 and a wavelength selection film 1013A (a first wavelength selection film) configuring a wavelength conversion section are disposed in this order to face an organic layer 1011 (a light-emitting layer) as a light source.

The wavelength conversion layer 1012 converts excitation light λ1 applied from the organic layer 1011 thereto into light λ2 of a wavelength different from that of the excitation light λ1, and then emits the light λ2. In this case, blue light is used as the excitation light λ1, and the wavelength conversion layer 1012 converts the blue light into red or green light λ2. The wavelength conversion layer 1012 uses, as a material, a fluorescent dye, a compound semiconductor quantum dot, inorganic nanocrystal, or the like, and is formed through distributing the material in a resin and then forming a layer of the resin, or burying the material in an inorganic material such as an oxide film and then forming a layer of the inorganic material.

The wavelength selection film 1013A reflects light of a specific wavelength or allows the light to pass therethrough, and in the embodiment, the wavelength selection film 1013A reflects the light (blue light) λ1 of an excitation wavelength, and allows the light (red light or green light) λ2 of a wavelength other than the excitation wavelength to pass therethrough. The wavelength selection film 1013A is configured of, for example, inorganic laminate films with different refractive indices, and has extremely high wavelength selectivity. As materials of the wavelength selection film 1013A, for example, a metal oxide such as silicon dioxide ($SiO_2$), titanium oxide ($TiO_2$), or zirconium oxide ($ZrO_2$) or a metal nitride may be used. Alternatively, as the materials of the wavelength selection film 1013A, a material used for an anti-reflective film such as a lens, more specifically, for example, a metal fluoride such as calcium fluoride ($CaF_2$) or magnesium fluoride ($MgF_2$) may be used.

Respective laminate films configuring the wavelength selection film 1013A each preferably have, for example, a thickness of approximately 5 nm to 200 nm, and when 20 to 90 films with such a thickness are laminated, the total thickness is approximately 0.5 μm to 4 μm. When materials having a large refractive index difference therebetween are selected from the above-described materials and films made of the materials are laminated, the number of films laminated in the wavelength selection film 1013A may be reduced.

It is to be noted that "reflecting light of a specific wavelength" here is not necessarily "reflecting 100% of light of a specific wavelength", and is preferably "reflecting 95% or over of the light", and more preferably "reflecting 99% or over of the light". Moreover, "allowing light of a specific wavelength to pass therethrough" is not necessarily "allowing 100% of light of a specific wavelength to pass therethrough", and is preferably "allowing 85% or over of the light to pass therethrough", and more preferably "allowing 95% or over of the light to pass therethrough".

In the embodiment, the wavelength conversion section having the above-described configuration is disposed in the light-emitting device 1010 (refer to FIG. 13) to suppress color mixture by mixture of light converted by the wavelength conversion layer 1012 and unconverted light.

[Entire Configuration of Display Unit]

Figure 13:
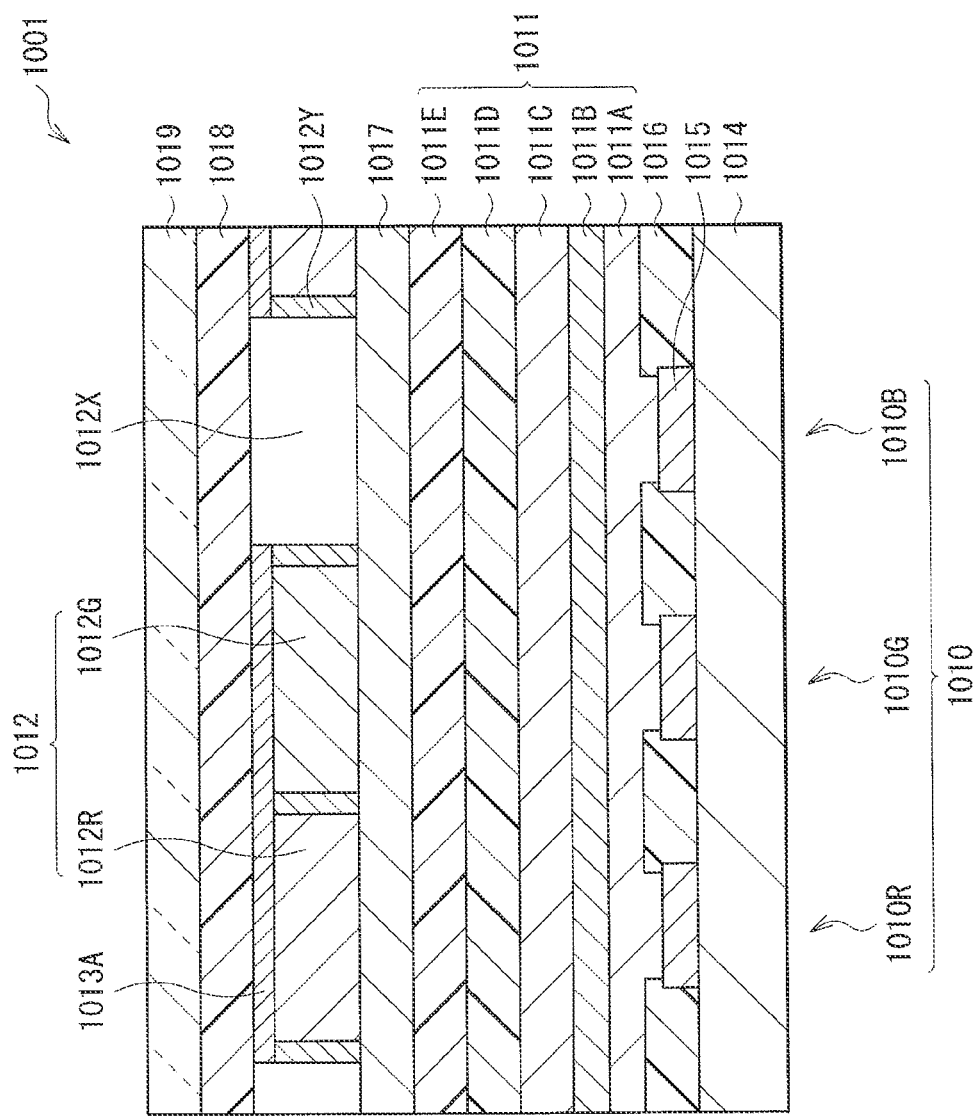
FIG. 13 is a sectional view of a display unit including the light-emitting device illustrated in FIG. 12.

Next, an entire configuration of a display unit 1001 including the light-emitting devices 1010 which each include the above-described wavelength conversion section will be described below. FIG. 13 illustrates a sectional configuration of the display unit 1001 including red light-emitting devices 1010R, green light-emitting devices 1010G, and blue light-emitting devices 1010B as the light-emitting devices 1010. A driving transistor Tr1 of a pixel drive circuit 1140 which will be described later (refer to FIG. 14) and a planarization insulating film (not illustrated) are disposed between the light-emitting devices 1010R, 1010G, and 1010B and a substrate 1014. As a specific configuration, a lower electrode 1015 as an anode, a barrier rib 1016, the organic layer 1011 including a light-emitting layer 1011C as a light source, and an upper electrode 1017 as a cathode are laminated in this order on a side closer to the substrate 1014, and the above-described wavelength conversion section is disposed on the upper electrode 1017.

The red light-emitting devices 1010R, the green light-emitting devices 1010G, and the blue light-emitting devices 1010B are covered with a protective layer 1018, and a sealing substrate 1019 made of glass or the like is bonded to an entire surface of the protective layer 1018 with an adhesive layer (not illustrated) made of a thermosetting resin, an ultraviolet curable resin, or the like in between to seal the light-emitting devices 1010R, 1010G, and 1010B.

The substrate 1014 is a supporting body having one main surface on which the red light-emitting devices 1010R, the green light-emitting device 1010G, and the blue light-emitting devices 1010B are formed and arranged, and an existing substrate, for example, a film, a sheet, or the like made of quartz, glass, metal foil, or a resin may be used. In particular, quartz or glass is preferably used. In the case where the substrate 1014 is made of a resin, metacrylate resins typified by polymethyl methacrylate (PMMA), polyesters such as polyethylene terephthalate (PET), polyethylene naphthalate (PEN), and polybutylene naphthalate (PBN), polycarbonate resins, and the like may be used as the resin; however, it is necessary for the substrate 1014 to have a laminate configuration and to be subjected to surface treatment to reduce water permeability and gas permeability.

The lower electrode 1015 is disposed on the substrate 1014 for each of the red light-emitting devices 1010R, the green light-emitting devices 1010G, and the blue light-emitting devices 1010B. The lower electrode 1015 has a thickness in a laminate direction (hereinafter simply referred to as "thickness") of approximately 10 nm to 1000 nm both inclusive, and is made of a simple substance or an alloy of a metal element such as molybdenum (Mo), chromium (Cr), gold (Au), platinum (Pt), nickel (Ni), copper (Cu), tungsten (W), or silver (Ag). Moreover, the lower electrode 1015 may have a laminate configuration of a metal film made of the simple substance or the alloy of any of the above metal elements and a transparent conductive film made of an oxide of indium and tin (indium tin oxide; ITO), an oxide of aluminum and zinc (aluminum-doped zinc oxide; AZO), an oxide of gallium and zinc (gallium-doped zinc oxide; GZO), InZnO (indium zinc oxide), or the like.

It is to be noted that, in the case where the lower electrode 1015 is used as the anode, the lower electrode 1015 is desirably made of a material with high hole injection properties. However, even a material, such as an aluminum (Al) alloy, has an issue of a hole injection barrier caused by the presence of an oxide film on a surface thereof or an insufficient work function may be used as the lower electrode 1015 through including an appropriate hole injection layer 1011A.

The barrier rib 1016 secures insulation between the lower electrodes 1015 and the upper electrode 1017 and forms a light emission region in a desired shape. Examples of the material of the barrier rib 1016 include inorganic insulating materials such as $SiO_2$ and photosensitive resins such as positive type photosensitive polybenzoxazole and a positive type photosensitive polyimide. In the barrier rib 1016, an opening is arranged corresponding to each light emission region. It is to be noted that layers from the organic layer 1011 to the upper electrode 17 may be arranged not only in the opening but also on the barrier rib 1016, but light is emitted only from the opening of the barrier rib 1016. Moreover, in the embodiment, the barrier rib 1016 has a single-layer configuration made of one kind of material; however, the barrier rib 1016 may have a laminate configuration made of a plurality of materials. Further, only the lower electrodes 1015 may be patterned without forming the barrier rib 1016, and the organic layer 1011 including a hole injection layer 1011A and subsequent layers may be provided as a common layer.

The organic layer 1011 of each of the light-emitting devices 1010R, 1010G, and 1010B has a configuration formed through laminating, in order from a side closer to the lower electrode 1015, for example, the hole injection layer 1011A, a hole transport layer 1011B, the light-emitting layer 1011C, an electron transport layer 1011D, and an electron injection layer 1011E. The organic layer 1011 is provided as a common layer for the light-emitting devices 1010R, 1010G, and 1010B.

The hole injection layer 1011A enhances hole injection efficiency to the light-emitting layer 1011C and is a buffer layer for preventing leakage. For example, the thickness of the hole injection layer 1011A is preferably approximately 5 nm to 100 nm both inclusive, and more preferably approximately 8 nm to 50 nm both inclusive.

The material of the hole injection layer 1011A may be selected as appropriate based on the material of an electrode or an adjacent layer, and polyaniline, polythiophene, polypyrrole, polyphenylene vinylene, polythienylene vinylene, polyquinoline, polyquinoxaline or a derivative thereof, a conductive polymer such as a polymer including an aromatic amine structure in a main chain or a side chain, metal phthalocyanine (such as copper phthalocyanine), carbon, or the like is used.

In the case where the material used for the hole injection layer 1011A is a polymer material, the weight-average molecular weight (Mw) of the polymer material may be within a range of approximately 5000 to 300000 both inclusive, and in particular, the weight-average molecular weight of the polymer material is preferably within a range of approximately 10000 to 200000 both inclusive. Moreover, an oligomer with an Mw of approximately 2000 to 5000 both inclusive may be used. However, in the case where the Mw is smaller than 5000, the hole injection layer may be melted while forming the hole transport layer and subsequent layers. Moreover, in the case where the Mw is larger than 300000, the material may be gelated to cause a difficulty in film formation.

Examples of a typical conductive polymer used as the material of the hole injection layer 1011A include polyaniline, oligoaniline, and polydioxythiophene such as poly(3, 4-ethylenedioxythiophene) (PEDOT). In addition, a commercially-available polymer called Nafion (trademark) available from H.C. Starck GmbH, a commercially-available polymer in a dissolved form called Liquion (trademark) as a trade name, ELsource (trademark) available from Nissan Chemical Industries. Ltd., a conductive polymer called Verazol (trademark) available from Soken Chemical & Engineering Co., Ltd., or the like is used.

The hole transport layer 1011B of each of the light-emitting devices 1010R, 1010G, and 1010B enhances hole transport efficiency to the light-emitting layer 1011C. For example, the thickness of the hole transport layer 1011B, depending on an entire device configuration, is preferably within a range of approximately 10 nm to 200 nm both inclusive, and more preferably within a range of approximately 15 nm to 150 nm both inclusive.

As the polymer material forming the hole transport layer 1011B, a light-emitting material which is soluble in an organic solvent, for example, polybinylcarbazole, polyfluorene, polyaniline, polysilane, or a derivative thereof, a polysiloxane derivative having an aromatic amine in a side chain or a main chain, polythiophene or a derivative thereof, or polypyrrole may be used. More preferably, a material having high adhesion with the hole injection layer 1011A and the light-emitting layer 1011C which are in contact with the hole transport layer 1011B and are disposed above and below the hole transport layer 1011B, respectively, is used.

The light-emitting layer 1011C emits light by the recombination of electrons and holes in response to the application of an electric field. For example, the thickness of the light-emitting layer 1011C, depending on the entire device configuration, is preferably within a range of approximately 10 nm to 200 nm both inclusive, and more preferably within a range of approximately 15 nm to 100 nm both inclusive. The light-emitting layer 1011C is made of a low-molecular material, and is made of, for example, two kinds of materials, i.e., a host material and a guest material. Specific examples of the host material include pyrrole, indole, carbazole, azaindole, azacarbazole, triazole, oxazole, oxadiazole, pyrazole, imidazole, thiophene, polyarylalkane, pyrazoline, pyrazolone, phenylene diamine, aryl amine, amino-substituted chalcone, styryl anthracene, fluorenone, hydrazone, stilbene, silazane, an aromatic tertiary amine compound, a styryl amine compound, a porphyrin-based compound, a polysilane-based compound, poly(N-vinylcarbazole), aniline-based copolymers, conductive high-molecular oligomers such as thiophene oligomers and polythiophenes, organic silanes, carbon films, pyridine, pyrimidine, triazine, imidazole, pyrazole, triazole, oxazole, oxadiazole, fluorenone, anthraquinodimethane, anthrone, diphenyl quinone, thiopyran dioxide, carbodiimide, fluorenylidene methane, distyrylpyrazine, fluorine-substituted aromatic compounds, heterocyclic tetracarboxylic anhydrides such as naphthalene perylene, phthalocyanine, metal complexes of a 8-quinolinol derivative, various metal complexes typified by a metal complex with metal phthalocyanine, benzoxazole or benzothiazole as a ligand and derivatives thereof (which may have a substituent group or a condensed ring).

As the guest material, materials with high light emission efficiency, for example, a low-molecular fluorescent material and an organic light-emitting material such as a phosphorescent pigment and a metal complex is used. More specifically, a compound having a peak wavelength of approximately 400 nm to 500 nm both inclusive is used. As such a compound, an organic material such as a naphthalene derivative, an anthracene derivative, a naphthacene derivative, a styrylamine derivative, or a bis(azinyl)methene boron complex may be used. In particular, the guest material is preferably selected from an aminonaphthalene derivative, an aminoanthracene derivative, an aminochrysene derivative, an aminopyrene derivative, a styrylamine derivative, a bis(azinyl) methene boron complex.

Moreover, in addition to the above-described materials, anthracene, naphthalene, phenanthrene, pyrene, tetracene, coronene, chrysene, fluorescein, perylene, phthaloperylene, naphthaloperylene, perinone, phthaloperinone, naphthaloperinone, diphenyl butadiene, tetraphenyl butadiene, coumarinoxadiazole, aldazine, bisbenzoxazoline, bisstyryl, pyrazine, cyclopentadiene, a quinoline metal complex, an aminoquinoline metal complex, a benzoquinoline metal complex, imine, diphenylethylene, vinylanthracene, diaminocarbazole, pyran, thiopyran, polymethine, merocyanine, an imidazole chelated oxinoid compound, quinacridone, aromatic hydrocarbon such as rubrene, and heterocyclic compounds may be used. Moreover, a light-emitting unit involving a triplet excited state may be used. Most of light-emitting units involving a triplet excited state are compounds including a metal complex such as iridium metal complex; however, the light-emitting unit involving a triplet excited state is not limited thereto, including the contained metal complex.

Moreover, a phosphorescent light-emitting material may be used. In particular, a metal complex including one or more kinds selected from metal elements of beryllium (Be), boron (B), zinc (Zn), cadmium (Cd), magnesium (Mg), gold (Au), silver (Ag), palladium (Pd), platinum (Pt), aluminum (Al), gadolinium (Ga), yttrium (Y), scandium (Sc), ruthenium (Ru), rhodium (Rh), osmium (Os), iridium (Ir), and the like may be used.

The electron transport layer 1011D enhances electron transport efficiency to the light-emitting layer 1011C, and is disposed on an entire surface of the light-emitting layer 1011C. For example, the thickness of the electron transport layer 1011D, depending on the entire device configuration, is preferably within a range of, for example, approximately 5 nm to 300 nm both inclusive, and more preferably within a range of approximately 10 nm to 170 nm both inclusive.

Examples of the material of the electron transport layer 1011D include quinoline, perylene, phenanthroline, bisstyryl, pyrazine, triazole, oxazole, fullerene, oxadiazole, fluorenone, derivatives thereof, and metal complexes thereof. Specific examples include tris(8-hydroxyquinolinato)aluminium (abbreviated as Alq3), anthracene, naphthalene, phenanthrene, pyrene, anthracene, perylene, butadiene, coumarin, C60, acridine, stilbene, 1,10-phenanthroline, derivatives thereof, and metal complexes thereof.

Moreover, the electron transport layer 1011D may use not only one kind of organic material, but also a mixture or a laminate of a plurality of kinds of organic materials. Further, the above-described compounds may be used for the electron injection layer 1011E which will be described later.

The electron injection layer 1011E enhances electron injection efficiency. As the material of the electron injection layer 1011E, for example, lithium oxide ($Li_2O$) which is an oxide of lithium (Li), cesium carbonate ($Cs_2CO_3$) which is a complex oxide of cesium (Cs), or a mixture of the oxide and the complex oxide may be used. Moreover, the material of the electron injection layer 1011E is not limited thereto, and, an alkali-earth metal such as calcium (Ca) or barium (Ba), an alkali metal such as lithium or cesium, and further, a metal with a small work function such as indium (In) or magnesium (Mg), or an oxide, a complex oxide, a fluoride, or the like of any of these metals may be used singly or in a mixture or an alloy thereof to improve stability.

The upper electrode 1017 has, for example, a thickness of approximately 2 nm to 15 nm both inclusive, and is configured of a metal conductive film. More specifically, an alloy of Al, Mg, Ca, or Na may be used. In particular, an alloy of magnesium and silver (an Mg—Ag alloy) is preferable, because the Mg—Ag alloy has both electrical conductivity and small absorption in a thin film. The ratio between magnesium and silver in the Mg—Ag alloy is not specifically limited, but the ratio is preferably within a range of Mg:Ag=approximately 20:1 to 1:1 both inclusive in film thickness ratio. Moreover, the material of the upper electrode 1017 may be an alloy of Al and Li (an Al—Li alloy).

Moreover, the upper electrode 1017 may be configured of a mixture layer including an organic light-emitting material such as an aluminum quinoline complex, a styrylamine derivative, or a phthalocyanine derivative. In this case, the upper electrode 1017 may further include, as a third layer, a layer with light transmittance such as MgAg. It is to be noted that, in the case of an active matrix drive system, the upper electrode 1017 as a solid film is formed on the substrate 1014 to be insulated from the lower electrodes 1015 by the organic layer 1011 and the barrier rib 1016.

In this embodiment, the above-described wavelength conversion section is disposed at a position corresponding to each of the red light-emitting devices 1010R and the green light-emitting devices 1010G on the upper electrode 1017. More specifically, for example, a wavelength conversion layer 1012R including cadmium celenide particles with a diameter of approximately 5 nm is disposed at a position corresponding to each red light-emitting device 1010R, and a wavelength conversion layer 1012G including cadmium selenide particles with a diameter of approximately 3 nm is disposed at a position corresponding to each green light-emitting device 1010E The wavelength selection film 1013A is disposed as a common film on these wavelength conversion layers 1012R and 1012G. It is to be noted that, in this embodiment, since the light-emitting layer 1011C emitting blue light is used as a light source, the wavelength conversion section is not disposed on the blue light-emitting devices 1010B. For example, a transparent layer 1012X made of a transparent resin such as acrylic or polystyrene is disposed on the blue light-emitting device 1010B, instead of the wavelength conversion layer 1012 and the wavelength selection film 1013A. Moreover, it is more desirable to dispose a shielding plate 1012Y using a material absorbing light, for example, a mixture of carbon, or a red, blue, or green pigment, or a metal reflecting light such as Al, titanium (Ti), or copper (Cu) between any adjacent two of the wavelength conversion layers 1012R and 1012G and the transparent layer 1012X.

The protective layer 1018 has, for example, a thickness of approximately 2 μm to 3 μm both inclusive, and may be made of an insulating material or a conductive material. As the insulating material, an inorganic amorphous insulating material, for example, amorphous silicon (α-Si), amorphous silicon carbide (α-SiC), amorphous silicon nitride (α-$Si_{1-x}N_x$), or amorphous carbon (α-C) is preferable. Such an inorganic amorphous insulating material does not form grains; therefore, the inorganic amorphous insulating material forms a favorable protective film with low water permeability.

The sealing substrate 1019 is located closer to the upper electrode 1017 of the red light-emitting devices 1010R, the green light-emitting devices 1010G and the blue light-emitting devices 1010B, and seals the light-emitting devices 1010R, 1010G, and 1010B together with an adhesive layer (not illustrated). In the case of a top emission system extracting light from a top side of the sealing substrate, the sealing substrate 1019 is made of a material transparent to light emitted from the light-emitting devices 1010R, 1010G, and 1010B such as glass. In the sealing substrate 1019, for example, a light-shielding film (not illustrated) as a black matrix is provided to extract light converted by the wavelength conversion layers 1012R and 1012G, and to absorb external light reflected by the red light-emitting devices 1010R, the green light-emitting devices 1010G, the blue light-emitting devices 1010B, and wiring therebetween, thereby improving contrast. It is to be noted that, in a bottom emission system extracting light from the lower electrode, transparency, with respect to visible light, of the sealing substrate 1040 is not considered.

The light-emitting devices 1010 according to this embodiment are top emission type light-emitting devices extracting, from a side opposite to the substrate 1014 (from the upper electrode 1017), light emitted by the recombination of holes injected from the lower electrode 1015 and electrons injected from the upper electrode 1017 in the light-emitting layer 1014B. When the top emission type light-emitting devices 1010 are used, an aperture ratio of a light emitting section of a display unit is improved. It is to be noted that the light-emitting devices 1010 according to the embodiment of the disclosure is not limited to such a configuration, and may be, for example, transmissive light-emitting devices extracting light from the substrate 1014, that is, bottom emission type light-emitting devices. At this time, the wavelength conversion section has a configuration in which the wavelength conversion layer 1012 and the wavelength selection film 1013A are laminated in order from a side closer to the organic layer 1011 between the substrate 1014 and the organic layer 1011.

[Plan Configuration of Display Unit]

Figure 14:
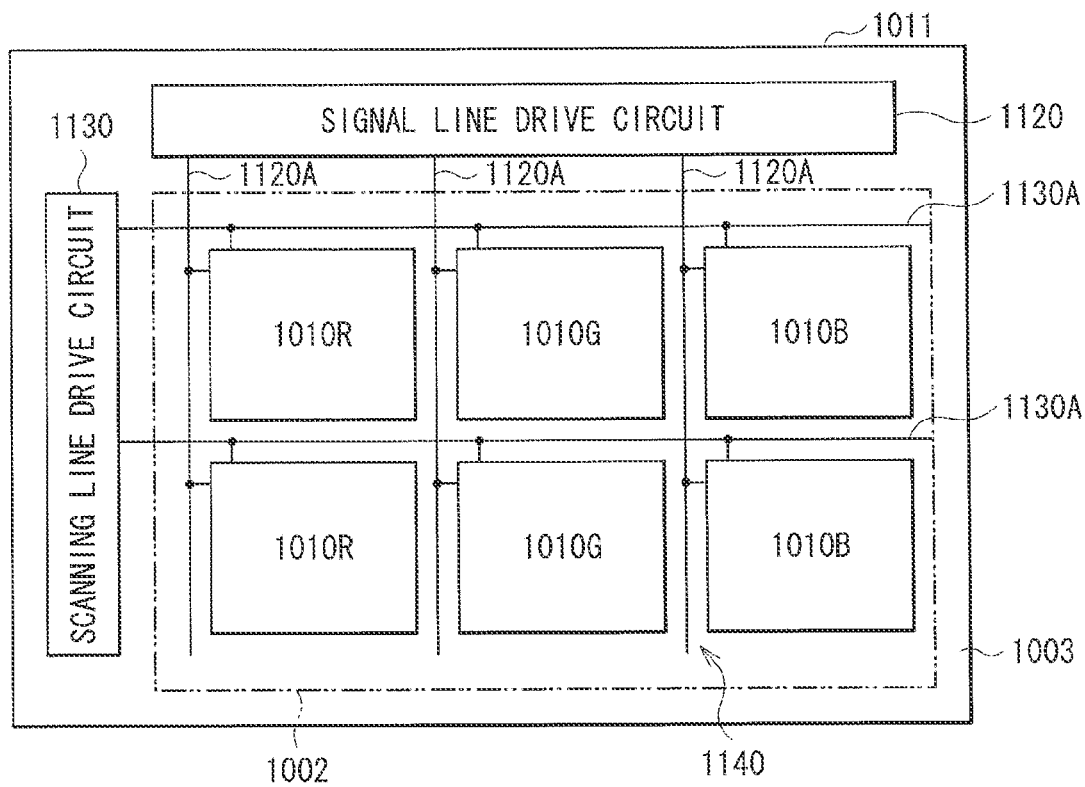
FIG. 14 is a plan view illustrating a configuration of the display unit illustrated in FIG. 13.

FIG. 14 illustrates a plan configuration of the display unit 1001 including the light-emitting devices 1010 according to the embodiment. The display unit 1001 is used as an organic EL television or the like, and includes, for example, a plurality of light-emitting devices 1010 (for example, the red light-emitting devices 1010R, the green light-emitting devices 1010G, and the blue light-emitting devices 1010B) which are arranged in a matrix as a display region 1110 on the substrate 1014. A signal line drive circuit 1120 and a scanning line drive circuit 1130 as drivers for image display are disposed around the display region 1110. It is to be noted that a combination of adjacent light-emitting devices 1010 configures one pixel.

Figure 15:
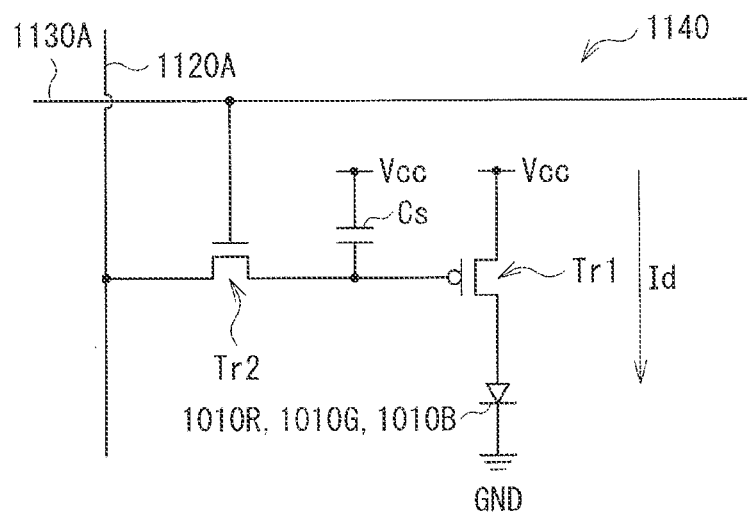
FIG. 15 is a diagram illustrating an example of a pixel drive circuit illustrated in FIG. 13.

A pixel drive circuit 1140 is disposed in the display region 1110. FIG. 15 illustrates an example of the pixel drive circuit 1140. The pixel drive circuit 1140 is an active drive circuit formed below the lower electrode 1015. In other words, the pixel drive circuit 1140 includes a driving transistor Tr1 and a writing transistor Tr2, a capacitor (retention capacitor) Cs between the driving transistor Tr1 and the writing transistor Tr2, and the light-emitting devices 1010 (for example, 1011R, 1011G, and 1011B) connected to the driving transistor Tr1 in series between a first power source line (Vcc) and a second power source line (GND). The driving transistor Tr1 and the writing transistor Tr2 each are configured of a typical TFT, and the TFT may have, for example, an inverted stagger configuration (a so-called bottom gate type) or a stagger configuration (a top gate type), and the configuration of the TFT is not specifically limited.

In the pixel drive circuit 1140, a plurality of signal lines 1120A are arranged in a column direction, and a plurality of scanning lines 1130A are arranged in a row direction. An intersection between each signal line 1120A and each scanning line 1130A corresponds to one (one sub-pixel) of the light-emitting devices 1010. Each signal line 1120A is connected to the signal line drive circuit 1120, and an image signal is supplied from the signal line drive circuit 1120 to a source electrode of the writing transistor Tr2 through the signal line 1120A. Each scanning line 1130A is connected to the scanning line drive circuit 1130, and a scanning signal is sequentially supplied from the scanning line drive circuit 1130 to a gate electrode of the writing transistor Tr2 through the scanning line 1130A.

[Manufacturing Method]

The display unit 1001 is manufactured by the following steps, for example. Respective layers from the lower electrode 1015 to the upper electrode 1017 configuring the light-emitting device 10 are formed by a dry process, for example, a vacuum deposition method, an ion beam method (an EB method), a molecular beam epitaxy method (an MBE method), a sputtering method, and an OVPD (Organic Vapor Phase Deposition) method.

Moreover, in addition to the above-described methods, the organic layer 1011 may be formed by a wet process, for example, a coating method such as a laser transfer method, a spin coating method, a dipping method, a doctor blade method, a discharge coating method, and a spray coating method, a printing method such as an ink-jet method, an offset printing method, a relief printing method, an intaglio printing method, a screen printing method, and a microgravure coating method, and the like, and both the dry process and the wet process may be used, depending on properties of each organic layer or each member.

Figure 16:
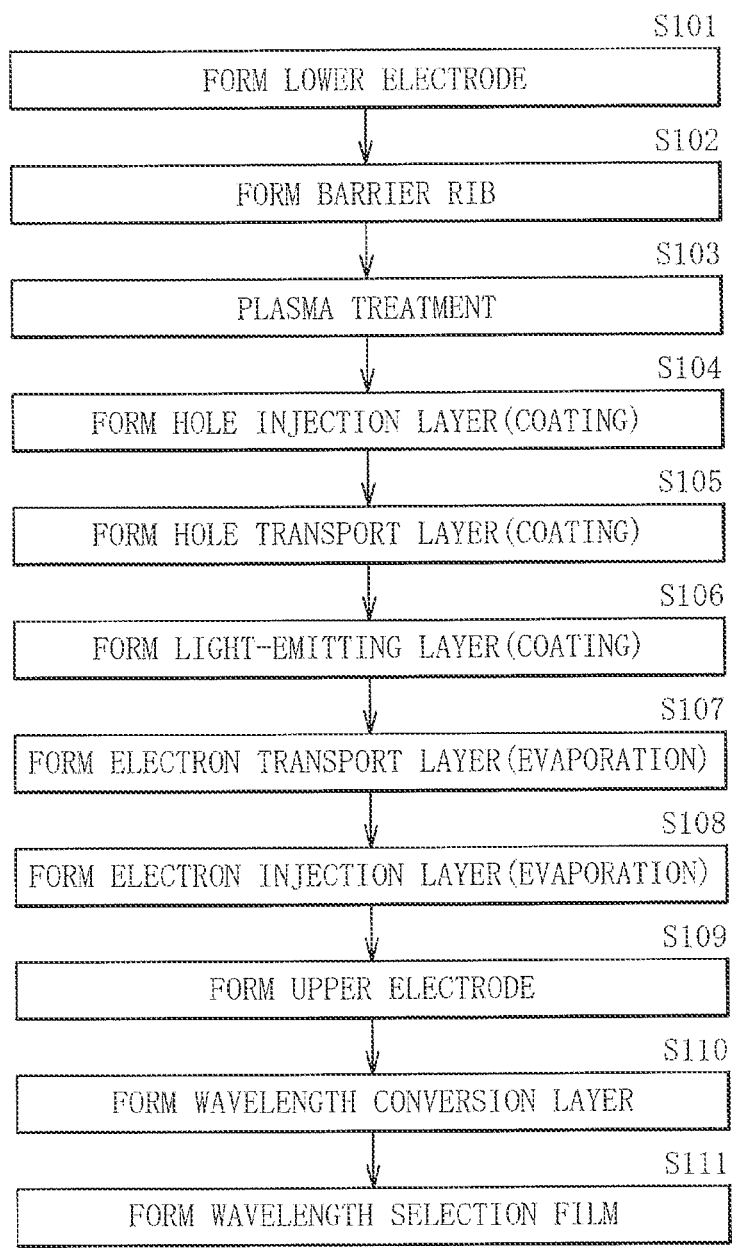
FIG. 16 is a flow chart illustrating a method of manufacturing the display unit illustrated in FIG. 13.

FIG. 16 illustrates a flow of a method of manufacturing the display unit 1001. First, the pixel drive circuit 1140 including the driving transistor Tr1 is formed on the substrate 1014 made of the above-described material, and a planarization insulating film (not illustrated) made of, for example, a photosensitive resin is provided.

[Step of Forming Lower Electrode 1015]

Next, a transparent conductive film made of, for example, ITO is formed on an entire surface of the substrate 1014, and the transparent conductive film is patterned to form the lower electrodes 1015 for the red light-emitting devices 1010R, the green light-emitting devices 1010G, and the blue light-emitting devices 1010B (step S101). At this time, each of the lower electrodes 1015 are electrically connected to a drain electrode of the driving transistor Tr1 through a contact hole (not illustrated) of the planarization insulating film (not illustrated).

[Step of Forming Barrier Rib 1016]

Next, a film made of an inorganic insulating material such as $SiO_2$ is formed on the lower electrodes 1015 and the planarization insulating film (not illustrated) by, for example, a CVD (Chemical Vapor Deposition) method to form the barrier rib 1016 (step S102).

After the barrier rib 1016 is formed, a surface where the lower electrodes 1015 and the barrier rib 1016 are formed of the substrate 1014 is subjected to oxygen plasma treatment to remove a contaminant such as an organic matter adhered to the surface; therefore, wettability is improved. More specifically, the substrate 1014 is heated at a predetermined temperature, for example, approximately 70° C. to 80° C., and then is subjected to plasma treatment ($O_2$ plasma treatment) using oxygen as a reactive gas under atmospheric pressure (step S103).

[Step of Forming Hole Injection Layer 1011A]

After the plasma treatment is performed, the hole injection layer 1011A made of the above-described material is formed in a region surrounded by the barrier rib 1016 (step S104). The hole injection layer 1011A is formed by a coating method such as a spin coating method, a slit printing method, or a liquid droplet discharging method. In particular, the forming material of the hole injection layer 1011A may be selectively applied to a region surrounded by the barrier rib 1016, and in this case, a method of selectively performing printing such as an ink-jet printing method which is a liquid droplet discharging method, a nozzle coating method, a gravure printing, or flexo printing is preferably used.

[Step of Forming Hole Transport Layer 1011B]

After the hole injection layer 1011A is formed, the hole transport layer 1011B including the above-described polymer material is formed on the hole injection layer 1011A (step S105). The hole transport layer 1011B is formed by a coating method such as a spin coating method, slit printing, or a liquid droplet discharging method.

[Step of Forming Light-Emitting Layer 1011C, Electron Transport Layer 1011D, Electron Injection Layer 1011E, and Upper Electrode 1017]

After the hole transport layer 1011B is formed, the light-emitting layer 1011C, the electron transport layer 1011D, the electron injection layer 1011E, and the upper electrode 1017 made of the above-described materials are formed by an evaporation method (steps S106, S107, S108, and S109).

It is to be noted that the light-emitting layer 1011C, the electron transport layer 1011D, the electron injection layer 1011E, and the upper electrode 1017 are desirably formed sequentially in one and the same film formation apparatus without being exposed to air. Therefore, deterioration in the organic layer 1011 due to water in air is preventable.

[Step of Forming Wavelength Conversion Section]

Next, after the upper electrode 1017 is formed, the light-shielding film made of the above-described material is formed on the upper electrode 1017. Then, the wavelength conversion layer 1012R is formed at a position corresponding to each red light-emitting device 1010R. The material of the wavelength conversion layer 1012R has, for example, a composition having photosensitivity, and coating with the material is performed by spin coating or the like, and the material is patterned by photolithography, and is fired to form the wavelength conversion layer 1012R. Next, in a manner similar to the manner of forming the wavelength conversion layer 1012R, the wavelength conversion layer 1012G is formed (step S110). Then, the wavelength selection film 1013A is formed on the wavelength conversion layer 1012R and the wavelength conversion layer 1012G with use of the above-described material by, for example, a CVD method, a sputtering method, or an evaporation method (step S111).

Then, the protective layer 1018 is formed by, for example, a film formation method in which film formation particles have small energy, for example, an evaporation method or a CVD method not to exert an influence on a base. For example, in the case where the protective layer 1018 made of amorphous silicon nitride is formed, the protective layer 1018 is formed by the CVD method to have a thickness of approximately 2 μm to 3 μm both inclusive. At this time, to prevent a decline in luminance due to deterioration in the organic layer 1011, it is desirable that the film formation temperature be set to room temperature and a film be formed under a condition that stress on the film be minimized to prevent peeling of the protective layer 1018.

Next, after the protective layer 1018 is formed, for example, the adhesive layer (not illustrated) is formed on the protective layer 1018, and then the sealing substrate 1019 made of the above-described material is bonded to the protective layer 1018 with the adhesive layer in between. Thus, the display unit 1001 illustrated in FIGS. 13 and 14 is completed.

In the display unit 1001, a scanning signal is supplied from the scanning line drive circuit 1130 to each pixel through a gate electrode of the writing transistor Tr2, and an image signal supplied from the signal line drive circuit 1120 through the writing transistor Tr2 is retained in the retention capacitor Cs. In other words, on/off control of the driving transistor Tr1 is performed in response to the signal retained in the retention capacitor Cs, and a drive current Id is thereby injected into each of the red light-emitting devices 10R, the green light-emitting devices 10G, and the blue light-emitting devices 10B to emit light by the recombination of electrons and holes. In the case of bottom emission, the light passes through the lower electrodes 1015 and the substrate 1014, and in the case of a top emission, the light passes through the upper electrode 1017, the wavelength conversion section, and the sealing substrate 1019, and then the light is extracted.

In a light-emitting device in related art, as described above in Japanese Unexamined Patent Application Publication No. H3-152897, blue light or ultraviolet light is used as excitation light, and three primary colors are obtained by a combination of the light-emitting device and the wavelength conversion layer. However, in such a configuration, unconverted excitation light which has not been absorbed in the wavelength conversion layer also passes through the wavelength conversion layer, and the light is mixed with red light or green light produced by wavelength conversion by the wavelength conversion layer to cause a decline in color purity.

On the other hand, in this embodiment, the wavelength conversion section including the wavelength conversion layer 1012 and the wavelength selection film 1013A allowing light of a fluorescence wavelength to pass therethrough and reflecting light of an excitation wavelength are disposed above the organic layer 1011 serving as a light source, in this case, on the upper electrode 1017. Therefore, unconverted excitation light which has not been absorbed in the wavelength conversion layer 1012 is reflected by the wavelength selection film 1013A, and leakage of the unconverted excitation light to outside is suppressed. Moreover, the excitation light is allowed to enter the wavelength conversion layer 1012 again.

Thus, in this embodiment, since the wavelength conversion section formed through laminating the wavelength conversion layer 1012 and the wavelength selection film 1013A in this order is disposed on the organic layer 1011 serving as the light source, leakage of the unconverted excitation light to outside is suppressed. Therefore, color mixture due to mixture of light of different wavelengths is suppressed to improve color purity.

Moreover, excitation light passing through the wavelength conversion layer 1012 without being converted is reflected by the wavelength selection film 1013A. Therefore, the excitation light is allowed to enter the wavelength conversion layer 1012 again, and then to be converted into light of a fluorescence wavelength. Accordingly, an improvement in use efficiency of the excitation light emitted from the light-emitting layer 1011C is achievable, thereby achieving an improvement in light emission efficiency.

Thus, it becomes possible to provide a display unit and an electronic apparatus each having high purity and high luminance.

Modification 4 of the third embodiment, a fourth embodiment, and Modification 5 of the fourth embodiment will be described below. It is to be noted that like components are denoted by like numerals as of the third embodiment and will not be further described.

(Modification 4)

Figure 17:
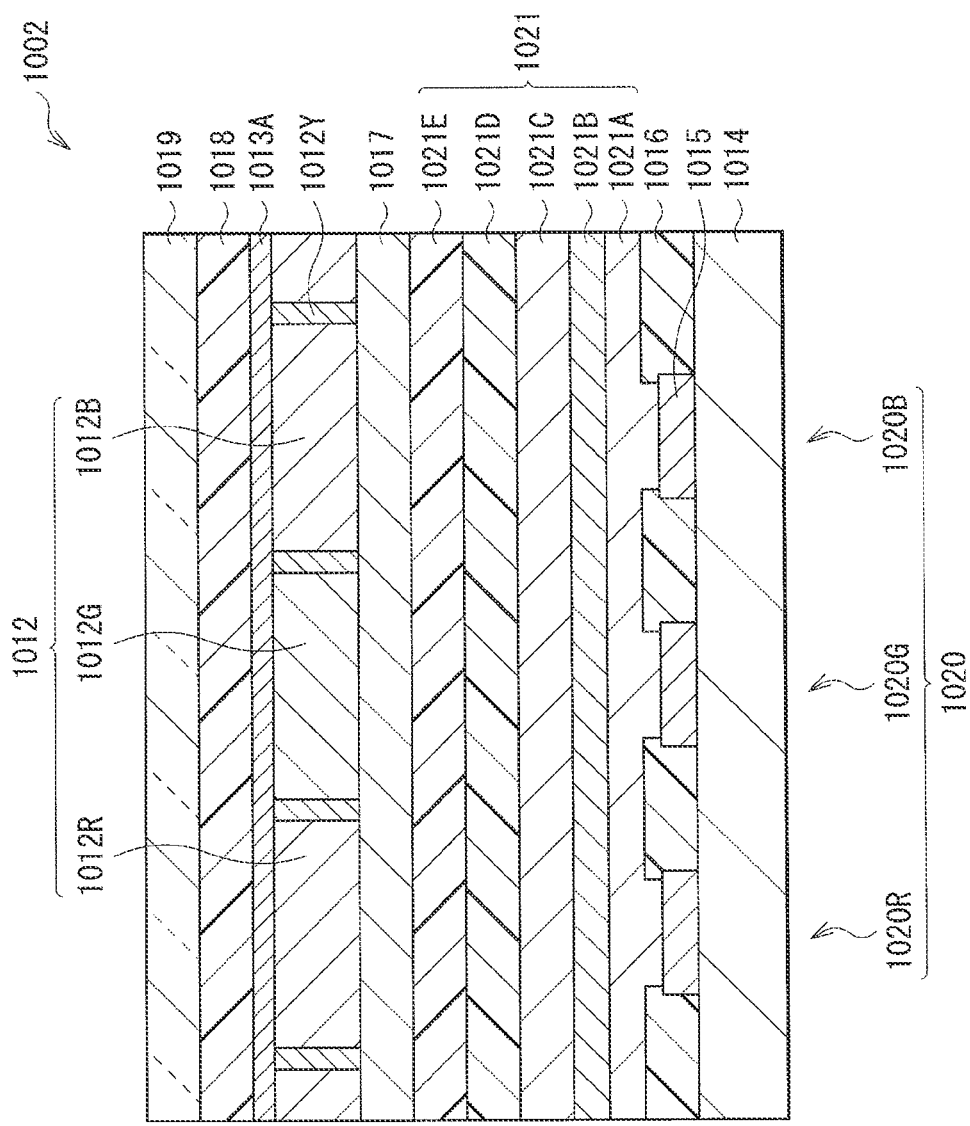
FIG. 17 is a sectional view of a display unit according to Modification 4 of the disclosure.

FIG. 17 illustrates a sectional configuration of a display unit 1002B including light-emitting devices 1020 according to a modification of the third embodiment. The light-emitting devices 1020 are different from those according to the third embodiment in that the light-emitting devices 1020 uses ultraviolet light (for example, light of a wavelength of approximately 300 nm to 400 nm both inclusive) as excitation light, and that the wavelength conversion section including the wavelength conversion layer 1012 and the wavelength selection film 1013A is disposed on the upper electrode 1017 of each blue light-emitting device 1020B of the light-emitting device 1020.

The wavelength conversion section disposed on each blue light-emitting device 1020B has a configuration similar to that of the wavelength conversion section on each of the red light-emitting devices 1010R and the green light-emitting devices 1010G in the above-described embodiment. As the material of a wavelength conversion layer 1012B configuring the wavelength conversion section on the blue light-emitting device 1020B, for example, cadmium selenide with a particle diameter of approximately 2.5 nm may be used. Moreover, the wavelength selection film 1013A for the blue light-emitting devices 1020B is formed as a common solid film for the red light-emitting devices 1020R and the green light-emitting devices 1020G.

In an organic layer 1021 in this modification, a light-emitting layer 1021C emits ultraviolet light as described above. Examples of a host material of the light-emitting layer 1021C include N,N'-diphenyl-N,N'-bis(3-methylpheynyl)-(1,1'-biphenyl)-4,4'-diamine (TPDA) and trans-4,4'-diphenyl stilbene (DPS), and examples of a guest material of the light-emitting layer 1021C include p-quatorphenyl (PQP), 1,4-bis (4-ethylstyryl)benzene (PESB), and 1,4-bis(2,2-di-p-tolylvinyl)benzene (DTVB).

In this modification, it is possible to provide a display unit with higher light emission efficiency through using, as excitation light, ultraviolet light having larger energy than blue light. Moreover, unlike the above-described embodiment, it is not necessary to remove the wavelength selection film at a position corresponding to each blue light-emitting device 1020B, and all of the light-emitting devices 1020R, 1020G, and 1020B of respective colors have a common configuration; therefore, compared to the above-described embodiment, manufacturing steps are simplified.

(Fourth Embodiment)

Figure 18:
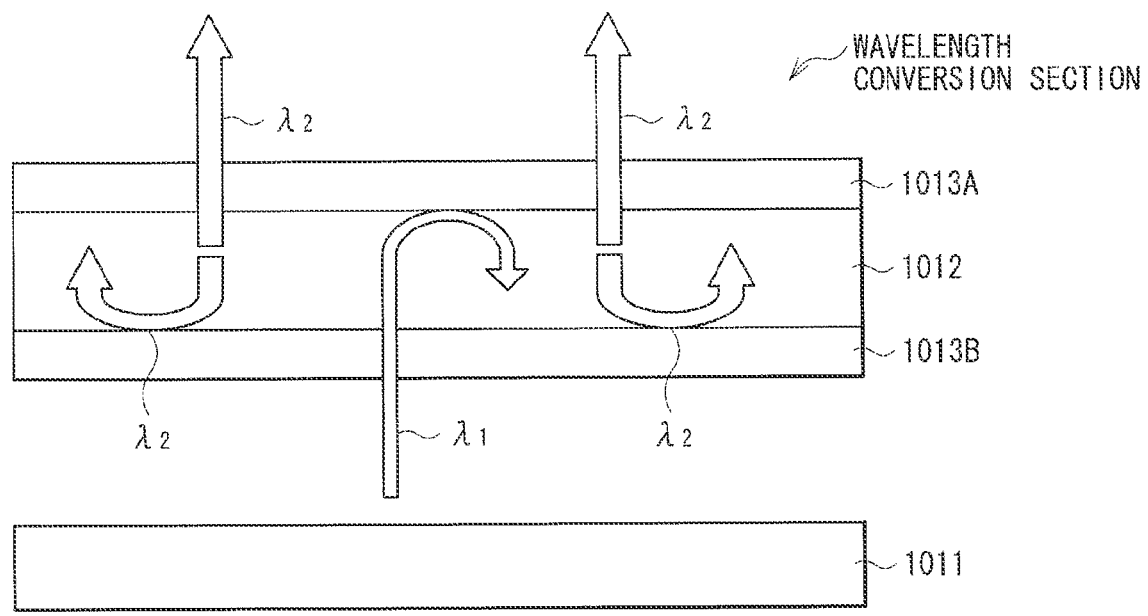
FIG. 18 is a schematic view illustrating a configuration of a light-emitting device according to a fourth embodiment of the disclosure.
Figure 19:
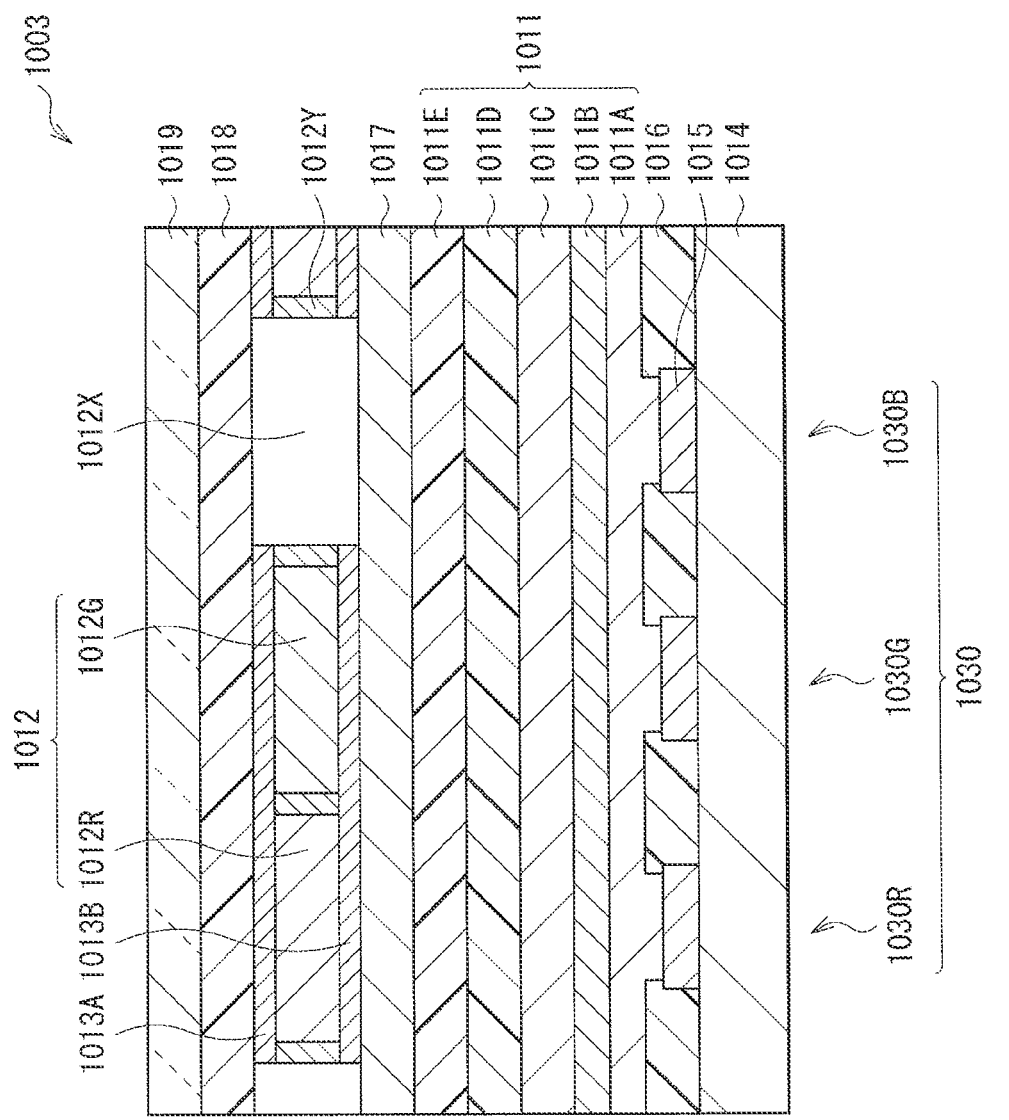
FIG. 19 is a sectional view of a display unit including the light-emitting device illustrated in FIG. 18.

FIG. 18 schematically illustrates a light-emitting device 1030 according to the fourth embodiment of the disclosure. The light-emitting device 1030 has a configuration, as a wavelength conversion section, in which the wavelength conversion layer 1012 is sandwiched between the wavelength selection film 1013A (the first wavelength selection film) and a wavelength selection film 1013B (a second wavelength selection film). FIG. 19 illustrates a sectional configuration of a display unit 1003 including the light-emitting devices 1030 illustrated in FIG. 18, and the light-emitting device 1030 according to this embodiment has a configuration similar to that according to the third embodiment, except for the wavelength conversion section.

The wavelength selection film 1013B reflects light of a specific wavelength or allows the light to pass therethrough as in the case of the wavelength selection film 1013A, and in this embodiment, the wavelength selection film 1013B allows light $\lambda 1$ of an excitation wavelength to pass therethrough and reflects light $\lambda 2$ of a wavelength other than the excitation wavelength. The wavelength selection film 1013B is configured of, for example, inorganic laminate films with different refractive indices, and has extremely high wavelength selectivity. Laminate films configuring the wavelength selection film 1013B each preferably have, for example, a thickness of approximately 5 nm to 200 nm, and when 20 to 90 films with such a thickness are laminated, the total thickness is approximately 0.5 µm to 4 µm.

As materials of the wavelength selection film 1013B, for example, a metal oxide such as silicon dioxide ($SiO_2$), titanium oxide ($TiO_2$), or zirconium oxide ($ZrO_2$) or a metal nitride may be used. Alternatively, as the materials of the wavelength selection film 1013B, a material used for an anti-reflective film such as a lens, more specifically, a metal fluoride such as calcium fluoride ($CaF_2$) or magnesium fluoride ($MgF_2$) may be used. When materials having a large refractive index difference therebetween are selected from the above-described materials and films made of the materials are laminated, the number of films laminated in the wavelength selection film 1013B may be reduced. It is to be noted that, in this case, the wavelength selection film 1013B is not disposed in a region on each blue light-emitting device 1030B; however, the wavelength selection film 1013B may be disposed in the region. When the wavelength selection film 1013B is disposed also on the blue light-emitting devices 1030B to be formed as one solid film, a step of processing the wavelength selection film 1013B is removed to simplify manufacturing steps.

In the light-emitting device 1030 and the display unit 1003 according to the embodiment, the wavelength selection film 1013B allowing blue light as the excitation light $\lambda 1$ to pass therethrough and reflecting red light and green light as light λ2 of other wavelengths is disposed between the organic layer 1011 serving as the excitation light source and the wavelength conversion layer 1012. Therefore, in the wavelength conversion layer 1012, red light and green light applied to a downside of the light-emitting devices 1030 are reflected by the wavelength selection film 1013B toward a topside, i.e., in a display direction of the light-emitting devices 1030. Thus, in addition to the effects in the third embodiment, use efficiency of light converted by the wavelength conversion layer 1012 is improved; therefore, a further improvement in light emission efficiency is achievable.

[Modification 5]

Figure 20:
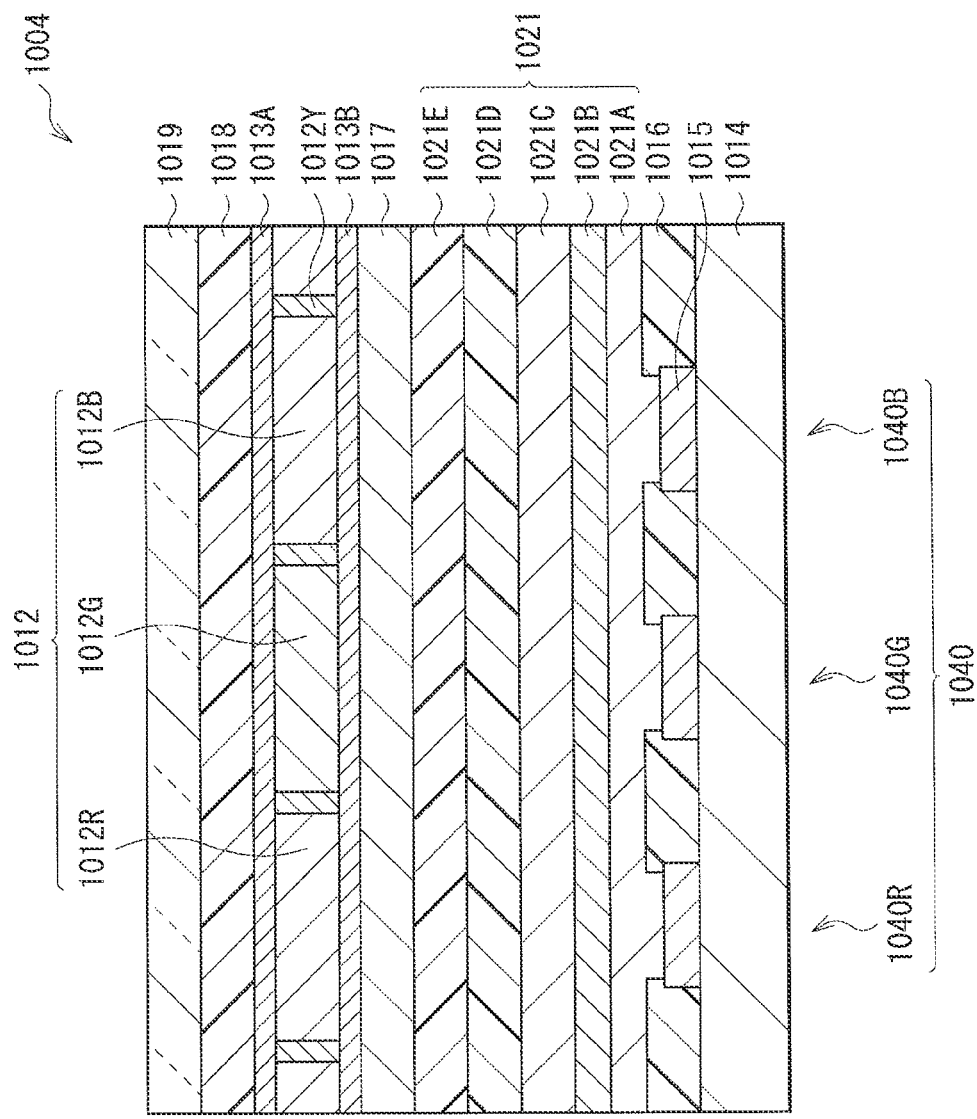
FIG. 20 is a sectional view of a display unit according to Modification 5 of the disclosure.

FIG. 20 illustrates a sectional configuration of a display unit 1004 including light-emitting devices 1040 according to a modification of the fourth embodiment. As in the case of Modification 4, the light-emitting devices 1040 are different from those according to the fourth embodiment in that ultraviolet light is used as excitation light, and that the wavelength conversion section is disposed on the upper electrode 1017 of each blue light-emitting device 1040B of the light-emitting device 1040.

In this modification, ultraviolet light having larger energy than blue light is used as excitation light, and the wavelength selection film 1013B is disposed between the organic layer 1021 and the wavelength conversion layer 1012. Therefore, it is possible to provide the display unit 1004 having higher light emission efficiency than the display units 1002 and 1003 according to Modification 4 and the fourth embodiment, while manufacturing steps are simplified.

The first to fourth embodiments are applicable not only singly, but also in a combination of the first and third embodiments, in a combination of the first and fourth embodiments, in a combination of the second and third embodiments, or in a combination of the second and fourth embodiments, and a synergistic effect is obtained by such a combination.

APPLICATION EXAMPLES

Module and Application Examples

Application examples of the display units described in the above-described embodiments and the modifications thereof will be described below. The display units according to the above-described embodiments and the like are applicable to display units of electronic apparatuses, in any fields, displaying an image signal supplied from outside or an image signal produced inside as an image or a picture, such as televisions, digital cameras, notebook personal computers, portable terminal devices such as cellular phones, and video cameras.

[Module]

Figure 21:
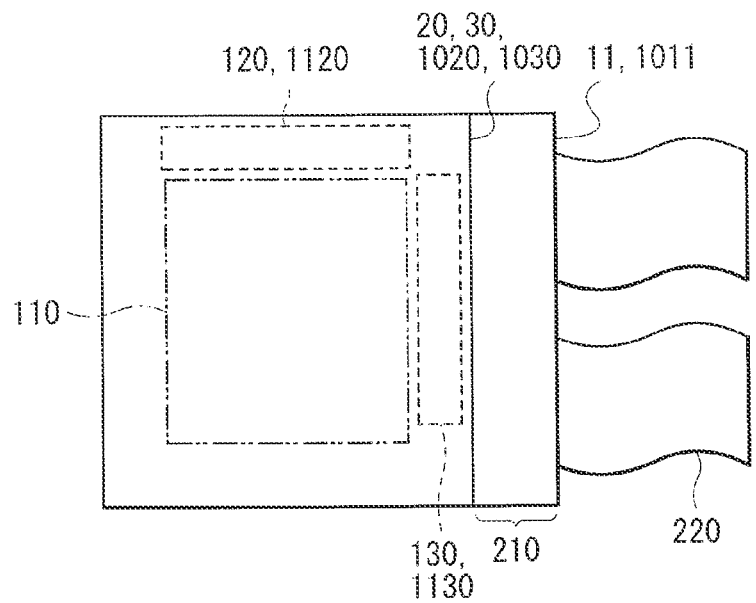
FIG. 21 is a plan view illustrating a schematic configuration of a module including the display unit according to any one of the above-described embodiments.

The display unit according to any one of the above-described embodiments and the like is incorporated into various electronic apparatuses such as Application Examples 1 to 5 which will be described later as a module as illustrated in FIG. 21. In the module, for example, a region 210 exposed from the protective layer 1018 and the sealing substrate 1019 is provided on a side of the substrate 1014, and an external connection terminal (not illustrated) is formed in the exposed region 210 through extending the wiring of the signal line drive circuit 1120 and the scanning line drive circuit 1130. In the external connection terminal, a flexible printed circuit (FPC) 220 for signal input and output may be provided.

Application Example 1

Figure 22:
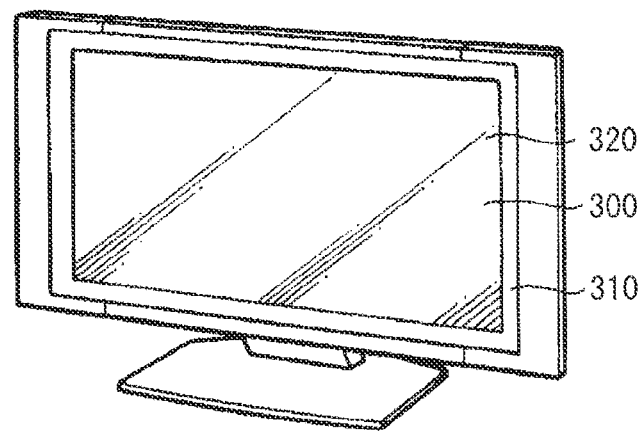
FIG. 22 is a perspective view illustrating an appearance of Application Example 1 of the display unit according to any one of the above-described embodiments.

FIG. 22 illustrates an appearance of a television to which any one of the display units according to the above-described embodiments and the like is applied. The television includes, for example, an image display screen section 300 including a front panel 310 and a filter glass 320, and the image display screen section 300 is configured of any one of the display units according to the above-described embodiments and the like.

Application Example 2

Figure 23A:
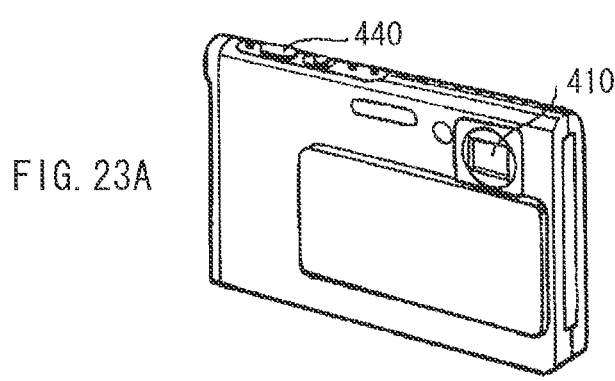
FIGS. 23A and 23B are perspective views illustrating an appearance of Application Example 2 from a front side and a back side, respectively.
Figure 23B:
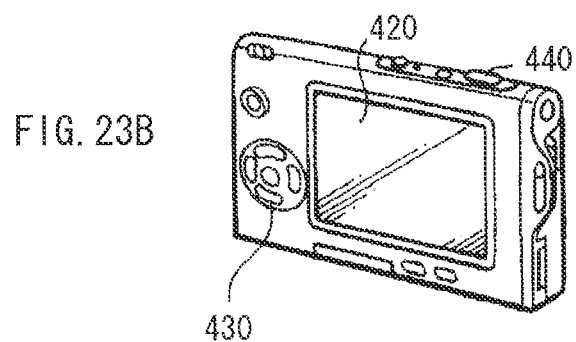

FIGS. 23A and 23B illustrate an appearance of a digital camera to which any one of the display units according to the above-described embodiments and the like is applied. The digital camera includes, for example, a light-emitting section 410 for a flash, a display section 420, a menu switch 430, and a shutter button 440, and the display section 420 is configured of any one of the display units according to the above-described embodiments and the like.

Application Example 3

Figure 24:
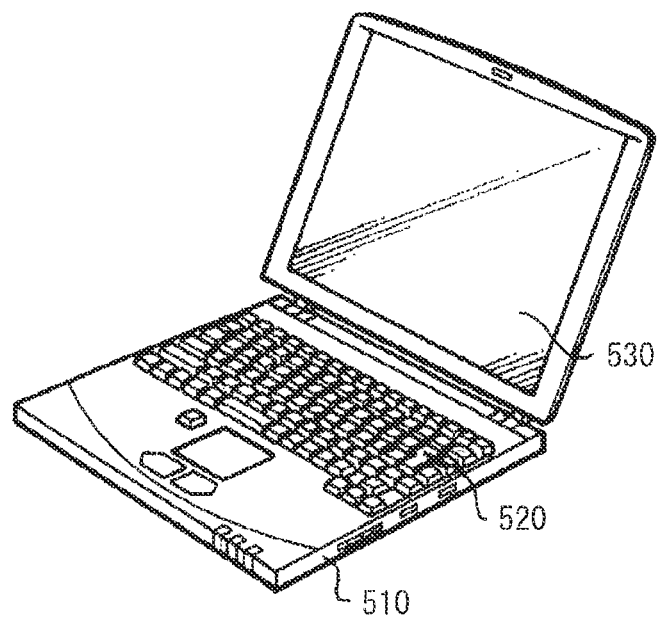
FIG. 24 is a perspective view illustrating an appearance of Application Example 3.

FIG. 24 illustrates an appearance of a notebook personal computer to which any one of the display units according to the above-described embodiments and the like is applied. The notebook personal computer includes, for example, a main body 510, a keyboard 520 for operation of inputting characters and the like, and a display section 530 for displaying an image, and the display section 530 is configured of any one of the display units according to the above-described embodiments and the like.

Application Example 4

Figure 25:
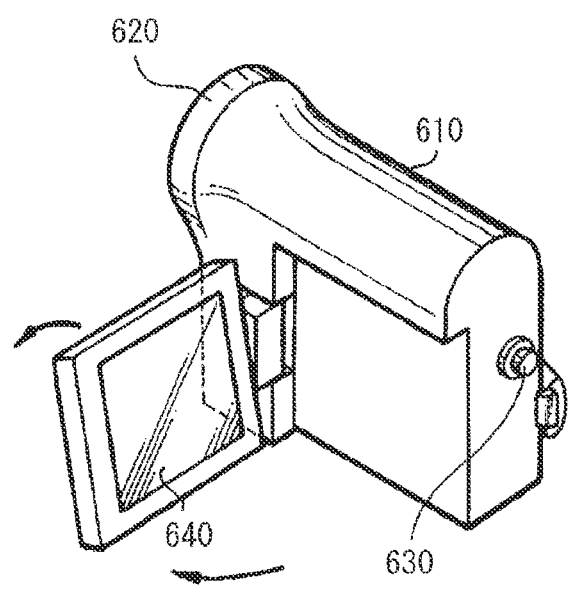
FIG. 25 is a perspective view illustrating an appearance of Application Example 4.
Figure 26:
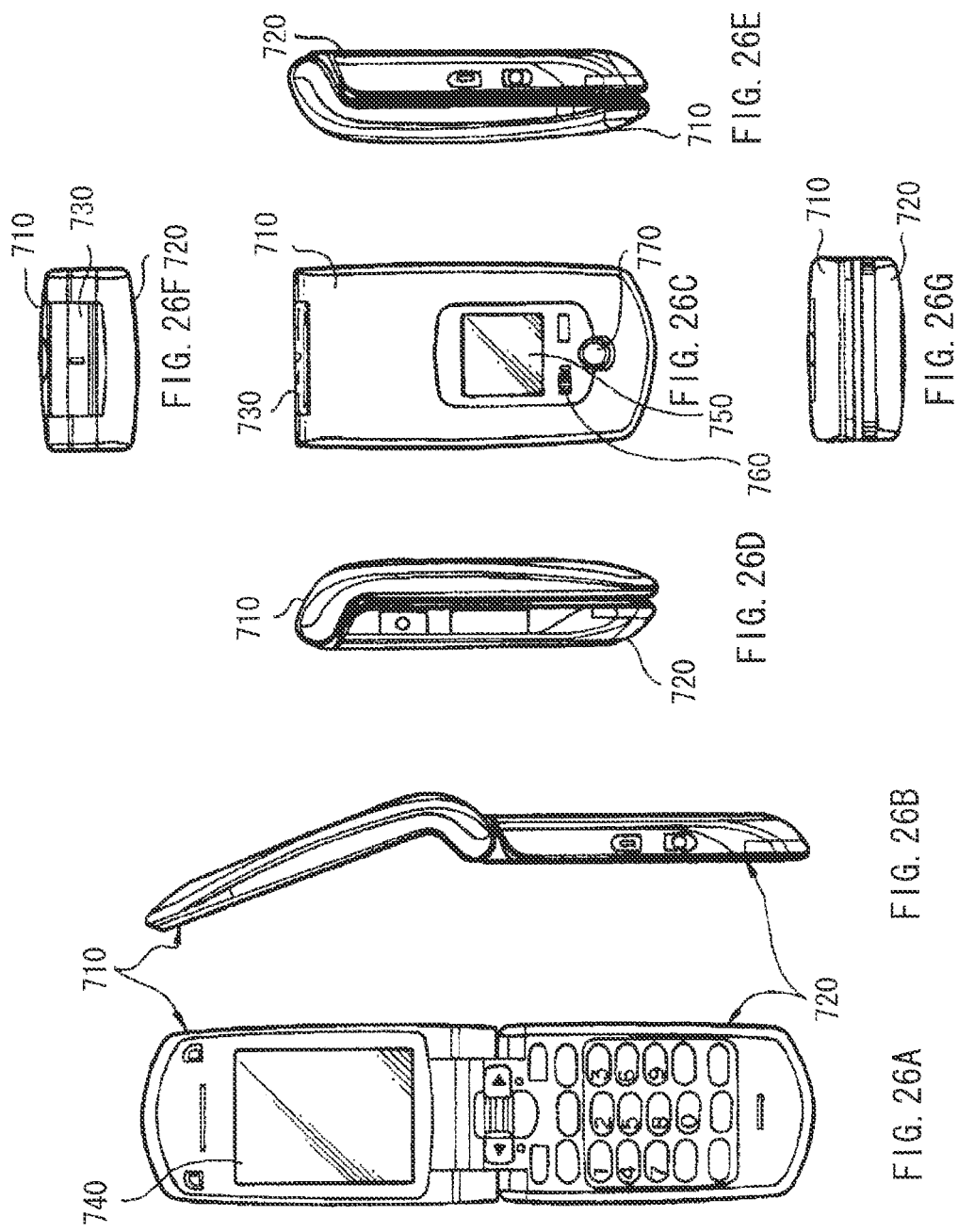
FIGS. 26A to 26G illustrate Application Example 5, where

FIG. 25 illustrates an appearance of a video camera to which any one of the display units according to the above-described embodiments and the like is applied. The video camera includes, for example, a main body 610, a lens 620 provided on a front surface of the main body 610 and for shooting an image of an object, a shooting start/stop switch 630, and a display section 640, and the display section 640 is configured of any one of the display units according to the above-described embodiments and the like.

Application Example 5

FIGS. 26A to 26G illustrate an appearance of a cellular phone to which any one of the display units according to the above-described embodiments and the like is applied. The cellular phone is formed by connecting, for example, a top-side enclosure 710 and a bottom-side enclosure 720 to each other by a connection section (hinge section) 730, and the cellular phone includes a display 740, a sub-display 750, a picture light 760, and a camera 770. The display 740 or the sub-display 750 is configured of any one of the display units according to the above-described embodiments and the like.

Examples

According to the above-described manufacturing method, the light-emitting devices 1010R, 1010G, and 1010B including the organic layer 1011 emitting blue light (Example 1) or ultraviolet light (Example 2) as an excitation light source and the wavelength conversion section were formed. The wavelength conversion section was formed through laminating the wavelength conversion layer 1012 and the wavelength selection film 1013A in this order from a side closer to the upper electrode 1017, between the upper electrode 1017 and the protective layer 1018. Moreover, as a comparative example, a display unit including red, green and blue light-emitting devices each including only the wavelength conversion layer 1012 formed on the upper electrode 1017 was formed. Further, display units in which the wavelength selection film 1013B was disposed below the wavelength conversion layer 1012 of the wavelength conversion section with a configuration similar to that in Examples 1 and 2 were formed as Examples 3 and 4, respectively. It is to be noted that the configuration of the wavelength selection film 1013A used herein is illustrated in Table 1 (Example 1, corresponding to the third embodiment) and Table 2 (Example 2, corresponding to Modification 4). Moreover, the configuration of the wavelength selection film 1013B is illustrated in Table 3 (Example 3, corresponding to the fourth embodiment) and Table 4 (Example 4, corresponding to Modification 5).

TABLE 1

| Material | Film Thickness (nm) |
|---|---|
| $TiO_2$ | 39.5 |
| $SiO_2$ | 25.6 |
| $TiO_2$ | 63.2 |
| $SiO_2$ | 71.8 |
| $TiO_2$ | 40.6 |
| $SiO_2$ | 41.2 |
| $TiO_2$ | 66.8 |
| $SiO_2$ | 63.3 |
| $TiO_2$ | 43.1 |
| $SiO_2$ | 65.8 |
| $TiO_2$ | 42.4 |
| $SiO_2$ | 69.4 |
| $TiO_2$ | 54.8 |
| $SiO_2$ | 51.4 |
| $TiO_2$ | 53.8 |
| $SiO_2$ | 53.0 |
| $TiO_2$ | 52.1 |
| $SiO_2$ | 73.4 |
| $TiO_2$ | 42.0 |
| $SiO_2$ | 67.4 |
| $TiO_2$ | 30.4 |
| $SiO_2$ | 128.0 |
| $TiO_2$ | 31.5 |
| $SiO_2$ | 66.9 |
| $TiO_2$ | 40.1 |
| $SiO_2$ | 66.1 |
| $TiO_2$ | 34.3 |
| $SiO_2$ | 29.9 |
| $TiO_2$ | 26.9 |
| $SiO_2$ | 58.8 |
| $TiO_2$ | 37.8 |
| $SiO_2$ | 68.1 |
| $TiO_2$ | 41.2 |
| $SiO_2$ | 75.2 |
| $TiO_2$ | 45.8 |
| $SiO_2$ | 63.6 |
| $TiO_2$ | 38.4 |
| $SiO_2$ | 72.0 |
| $TiO_2$ | 44.6 |
| $SiO_2$ | 84.9 |
| $TiO_2$ | 12.7 |
| 41 Layers | 2177.8 |

TABLE 2

| Material | Film Thickness (nm) |
|---|---|
| $TiO_2$ | 17.7 |
| $SiO_2$ | 42.6 |
| $TiO_2$ | 39.5 |
| $SiO_2$ | 44.6 |
| $TiO_2$ | 30.9 |
| $SiO_2$ | 59.1 |
| $TiO_2$ | 32.6 |
| $SiO_2$ | 48.0 |

TABLE 2-continued

| Material | Film Thickness (nm) |
|---|---|
| $TiO_2$ | 35.6 |
| $SiO_2$ | 57.5 |
| $TiO_2$ | 30.8 |
| $SiO_2$ | 54.1 |
| $TiO_2$ | 36.9 |
| $SiO_2$ | 54.6 |
| $TiO_2$ | 30.5 |
| $SiO_2$ | 57.1 |
| $TiO_2$ | 36.7 |
| $SiO_2$ | 50.7 |
| $TiO_2$ | 31.0 |
| $SiO_2$ | 59.5 |
| $TiO_2$ | 35.6 |
| $SiO_2$ | 49.2 |
| $TiO_2$ | 33.3 |
| $SiO_2$ | 61.1 |
| $TiO_2$ | 33.9 |
| $SiO_2$ | 48.2 |
| $TiO_2$ | 35.5 |
| $SiO_2$ | 60.5 |
| $TiO_2$ | 30.5 |
| $SiO_2$ | 49.9 |
| $TiO_2$ | 38.7 |
| $SiO_2$ | 58.5 |
| $TiO_2$ | 23.5 |
| $SiO_2$ | 56.9 |
| $TiO_2$ | 129.4 |
| $SiO_2$ | 49.7 |
| $TiO_2$ | 27.4 |
| $SiO_2$ | 54.9 |
| $TiO_2$ | 33.6 |
| $SiO_2$ | 57.3 |
| $TiO_2$ | 33.5 |
| $SiO_2$ | 42.2 |
| $TiO_2$ | 35.6 |
| $SiO_2$ | 72.2 |
| $TiO_2$ | 8.7 |
| $SiO_2$ | 88.4 |
| 46 Layers | 2098.3 |

TABLE 3

| Material | Film Thickness (nm) |
|---|---|
| $TiO_2$ | 68.6 |
| $SiO_2$ | 112.1 |
| $TiO_2$ | 60.2 |
| $SiO_2$ | 104.8 |
| $TiO_2$ | 59.3 |
| $SiO_2$ | 102.9 |
| $TiO_2$ | 59.2 |
| $SiO_2$ | 102.8 |
| $TiO_2$ | 59.3 |
| $SiO_2$ | 102.6 |
| $TiO_2$ | 59.0 |
| $SiO_2$ | 102.7 |
| $TiO_2$ | 59.1 |
| $SiO_2$ | 103.2 |
| $TiO_2$ | 59.7 |
| $SiO_2$ | 105.3 |
| $TiO_2$ | 61.8 |
| $SiO_2$ | 114.1 |
| $TiO_2$ | 72.5 |
| $SiO_2$ | 130.7 |
| $TiO_2$ | 72.8 |
| $SiO_2$ | 115.7 |
| $TiO_2$ | 63.6 |
| $SiO_2$ | 111.6 |
| $TiO_2$ | 62.2 |
| $SiO_2$ | 53.3 |
| 26 Layers | 2179.0 |

TABLE 4

| Material | Film Thickness (nm) |
|---|---|
| $TiO_2$ | 63.3 |
| $SiO_2$ | 61.0 |
| $TiO_2$ | 58.7 |
| $SiO_2$ | 73.8 |
| $TiO_2$ | 45.8 |
| $SiO_2$ | 88.5 |
| $TiO_2$ | 47.0 |
| $SiO_2$ | 70.3 |
| $TiO_2$ | 52.9 |
| $SiO_2$ | 83.0 |
| $TiO_2$ | 42.8 |
| $SiO_2$ | 113.6 |
| $TiO_2$ | 82.0 |
| $SiO_2$ | 92.7 |
| $TiO_2$ | 56.9 |
| $SiO_2$ | 80.1 |
| $TiO_2$ | 73.7 |
| $SiO_2$ | 125.9 |
| $TiO_2$ | 49.0 |
| $SiO_2$ | 116.3 |
| $TiO_2$ | 82.8 |
| $SiO_2$ | 105.7 |
| $TiO_2$ | 62.1 |
| $SiO_2$ | 136.8 |
| $TiO_2$ | 64.4 |
| $SiO_2$ | 36.3 |
| 26 Layers | 1965.3 |

Figure 30A:
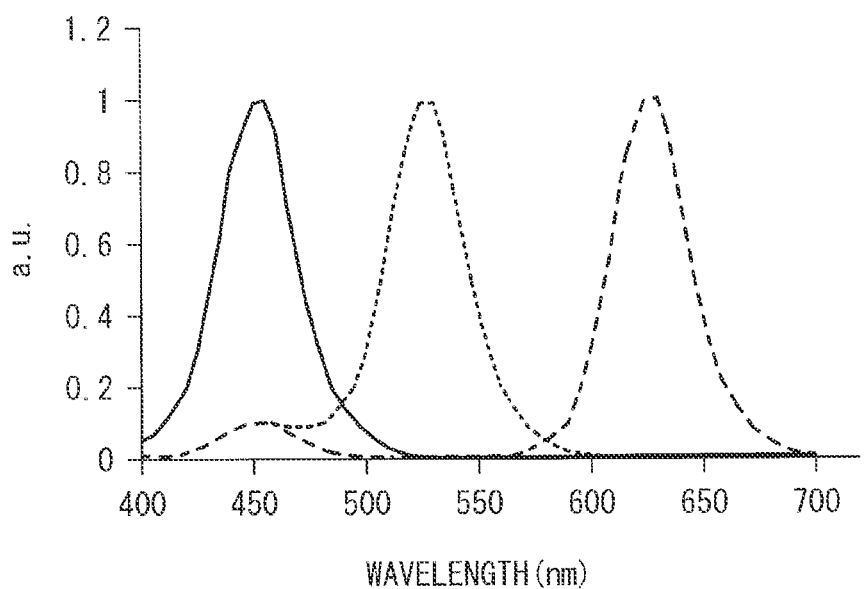
FIGS. 30A and 30B are plots illustrating emission spectra in a comparative example and an example, respectively.
Figure 30B:
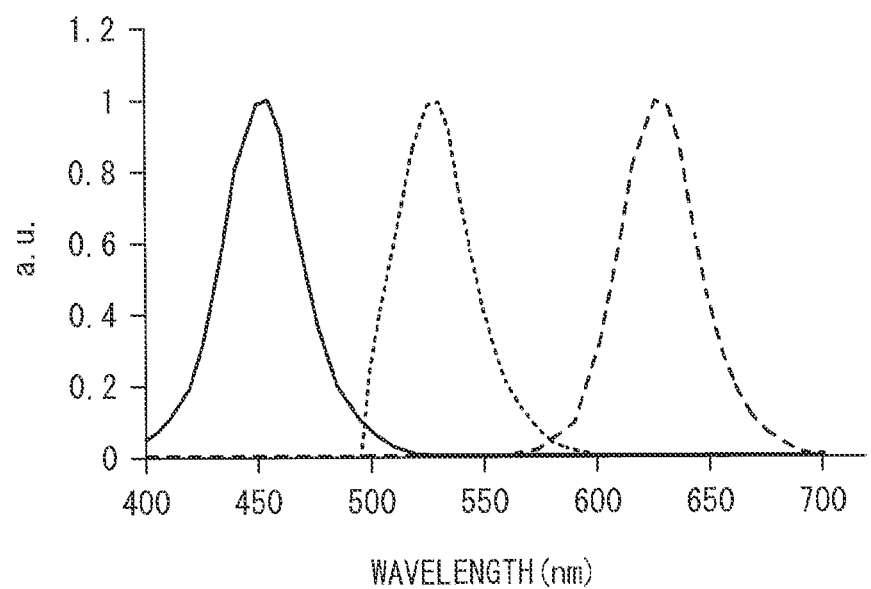

FIG. 30A illustrates emission spectra of the red light-emitting device, the green light-emitting device, and the blue light-emitting device in the comparative example. It was clear that, in this comparative example, the emission spectra of the red light-emitting device and the green light-emitting device had a peak around 450 nm. In other words, it was found out that blue light was mixed in the red light-emitting device and the green light-emitting device. On the other hand, in emission spectra (Example 1) of the red light-emitting device, the green light-emitting device, and the blue light-emitting device illustrated in FIG. 30B, the peak of the blue light was eliminated from the emission spectra of both the red light-emitting device and the green light-emitting device. In other words, it was found out that color mixture was prevented and color purity was improved through disposing the wavelength selection film 1013A on the wavelength conversion layer 1012. It is to be noted that a result similar to that in FIG. 30B was obtained in Example 2 as well as in Examples 3 and 4 in which, in addition to the wavelength selection film 1013A, the wavelength selection film 1013B was disposed below the wavelength conversion layer 1012.

Figure 31:
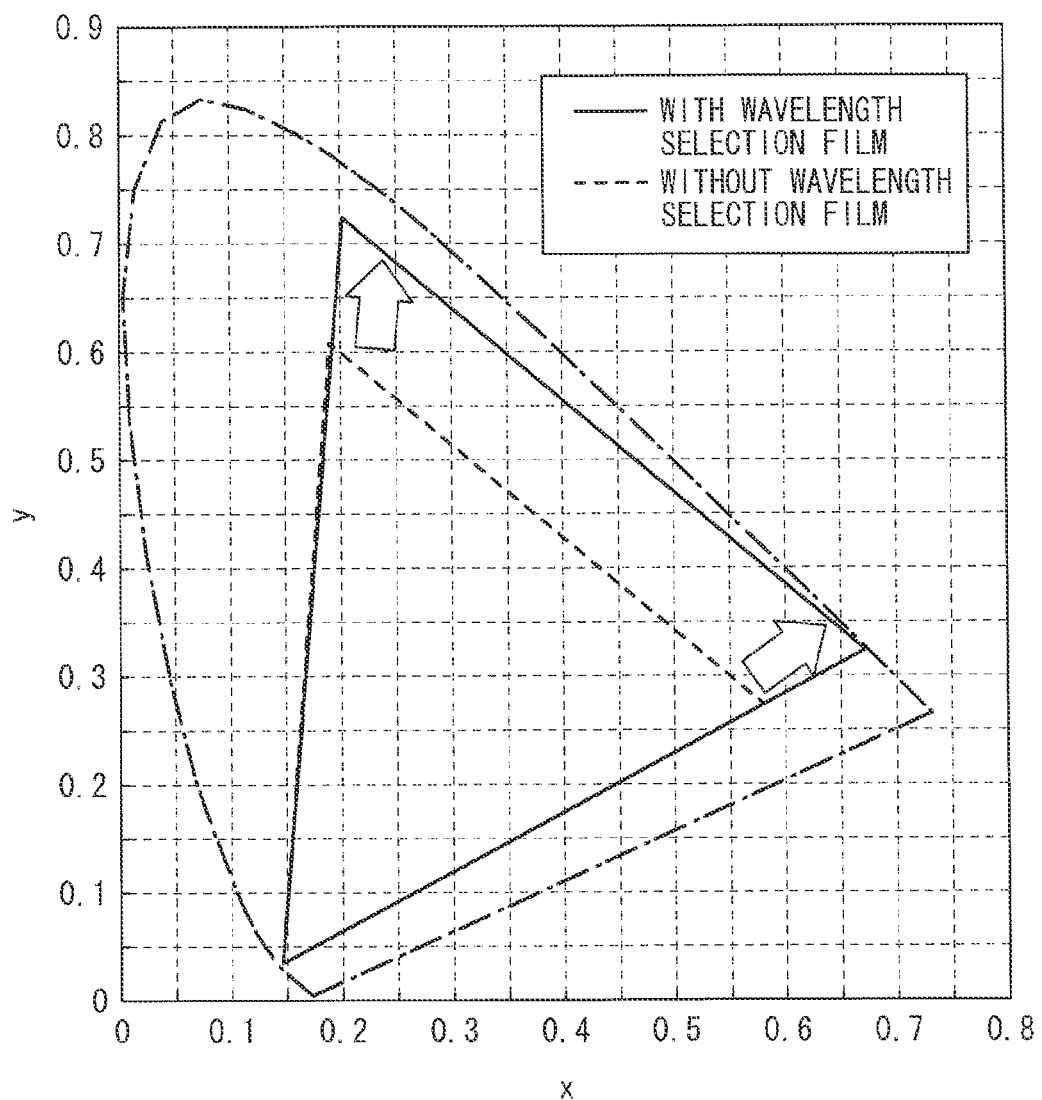
FIG. 31 is a chromaticity diagram illustrating color gamuts in the example and the comparative example.

FIG. 31 illustrates color gamuts (xy chromaticity diagram) of the display units in the examples (indicated by a solid line) and the comparative example (indicated by an alternate long and short dashed line). When the wavelength conversion layer and the wavelength selection film were combined to form the wavelength conversion section as in the case of the examples, a color gamut allowed to be displayed on the display unit was expanded.

Although the present disclosure is described referring to the above-described embodiments, the modification thereof, and the examples, the disclosure is not limited thereto, and may be variously modified.

For example, in the above-described embodiments, the display unit using the top emission type organic light-emitting devices is described; however, the disclosure is applicable to a bottom emission type organic display unit.

Moreover, in the above-described embodiments and the like, the display unit using the organic light-emitting devices is described as an example; however, the disclosure is applicable to, for example, a display unit using any other light-emitting devices such as inorganic light-emitting devices.

Further, in the above-described embodiments and the like, the separation film 21 with a tapered shape is described as an example; however, the separation film 21 may have any other shape. Moreover, for example, the material and thickness of each layer, the method and conditions of forming each layer are not limited to those described in the above-described embodiments and the like, and each layer may be made of any other material with any other thickness by any other method under any other conditions. For example, in the above-described embodiments and the like, the case where the photoexcited material 22 is a quantum dot is described; however, the photoexcited material may be any other light-emitting material.

Moreover, in the above-described embodiments and the like, the light-emitting device 1010 is used as an excitation light source; however, the excitation light source is not limited thereto, and as a light source, other devices applicable to a display unit such as a light-emitting diode (LED), a liquid crystal device using a blue light source as a backlight may be used.

In the above-described embodiments and the like, the active matrix display unit is described. However, the disclosure is applicable to a passive matrix display unit. Moreover, the configuration of a pixel drive circuit for active matrix drive is not limited to that described in the above-described embodiments and the like, and, if necessary, a capacitor or a transistor may be further included. In this case, a necessary drive circuit may be included in addition to the above-described signal line drive circuit 1120 and the above-described scanning line drive circuit 1130 according to a modification of the pixel drive circuit.

It is to be noted that the present disclosure may have the following configurations.

(1) A display unit including:
a plurality of light-emitting devices; and
a separation section disposed between any adjacent two of the plurality of light-emitting devices and including a photoexcited material.

(2) The display unit according to (1), in which the photoexcited material is excited by light from the light-emitting devices to emit light.

(3) The display unit according to (1) or (2), in which the photoexcited material is included in proximity to each of the light-emitting devices.

(4) The display unit according to any one of (1) to (3), in which the photoexcited material is a quantum dot.

(5) The display unit according to any one of (1) to (4), in which light from the light-emitting devices and light emitted from the photoexcited material are extracted parallel to each other.

(6) The display unit according to any one of (1) to (5), in which each of the light-emitting devices includes a first electrode, a functional layer including a light-emitting layer, and a second electrode in this order.

(7) The display unit according to (6), in which the functional layer is made of an organic material.

(8) The display unit according to any one of (1) to (7), in which all of the light-emitting devices emit light of a same color, and each include a color filter on a display plane side.

(9) The display unit according to (8), in which light is extracted from some of the light-emitting devices without passing through the color filter.

(10) The display unit according to any one of (1) to (7), in which the light-emitting devices adjacent to one another emit light of different colors.

(11) The display unit according to any one of (1) to (10), in which light from the light-emitting devices and light emitted from the photoexcited material are mixed together to produce white light.

(12) The display unit according to (11), in which the light-emitting devices emit blue light, and the photoexcited material emits yellow light.

(13) The display unit according to any one of (1) to (12), in which the photoexcited material located closer to a first side of the separation section and the photoexcited material located closer to a second side of the separation section emit light of different colors.

(14) An electronic apparatus including a display unit, the display unit including:
a plurality of light-emitting devices; and
a separation section disposed between any adjacent two of the plurality of light-emitting devices and including a photoexcited material.

(15) A method of manufacturing a display unit, the method including
forming a separation section between any adjacent two of a plurality of light-emitting devices, the separation section being formed through including a photoexcited material.

(16) An illumination unit including:
a plurality of light-emitting devices; and
a separation section disposed between any adjacent two of the plurality of light-emitting devices and including a photoexcited material.

(17) A light-emitting device including:
an excitation light source;
a wavelength conversion layer converting excitation light emitted from the excitation light source into light of a wavelength different from a wavelength of the excitation light; and
a wavelength selection film disposed on a surface farther from the excitation light source of the wavelength conversion layer.

(18) The light-emitting device according to (17), in which the wavelength selection film reflects light having a wavelength substantially equal to the wavelength of the excitation light and allows light having a wavelength different from the wavelength of the excitation light to pass therethrough.

(19) The light-emitting device according to (17) or (18), in which the wavelength conversion layer includes inorganic nanocrystal.

(20) A method of manufacturing a light-emitting device, the method including:
forming an excitation light source;
forming, on the excitation light source, a wavelength conversion layer converting excitation light emitted from the excitation light source into light of a wavelength different from a wavelength of the excitation light; and
forming a wavelength selection film on a surface farther from the excitation light source of the wavelength conversion layer.

The present application contains subject matter related to that disclosed in Japanese Priority Patent Application No. 2011-269990 filed in the Japan Patent Office on Dec. 9, 2011 and Japanese Priority Patent Application No. 2011-288285 filed in the Japan Patent Office on Dec. 28, 2011, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit comprising:
a pixel drive circuit including a driving transistor and a writing transistor;
a plurality of organic light-emitting devices respectively including a first electrode, an organic light-emitting layer, and a common second electrode; and
a separation section disposed between any adjacent two of the plurality of organic light-emitting devices and including a photoexcited material,
wherein the separation section is disposed between a respective first electrode and the common second electrode.

2. The display unit according to claim 1, wherein the photoexcited material is excited by light from the organic light-emitting devices to emit light.

3. The display unit according to claim 1, wherein the photoexcited material is included in proximity to each of the organic light-emitting devices.

4. The display unit according to claim 1, wherein the photoexcited material is a quantum dot.

5. The display unit according to claim 1, wherein light from the organic light-emitting devices and light emitted from the photoexcited material are extracted parallel to each other.

6. The display unit according to claim 1, wherein each of the organic light-emitting devices includes the first electrode, a functional layer including the organic light-emitting layer, and the common second electrode in this order.

7. The display unit according to claim 1, wherein all of the organic light-emitting devices emit light of a same color, and respective ones of the organic light-emitting devices include a color filter on a display plane side.

8. The display unit according to claim 7, wherein light is extracted from some of the organic light-emitting devices without passing through the color filter.

9. The display unit according to claim 1, wherein any adjacent two of the plurality of organic light-emitting devices emit light of different colors.

10. The display unit according to claim 1, wherein light from the organic light-emitting devices and light emitted from the photoexcited material are mixed together to produce white light.

11. The display unit according to claim 10, wherein the organic light-emitting devices emit blue light, and the photoexcited material emits yellow light.

12. The display unit according to claim 1, wherein the photoexcited material located closer to a first side of the separation section and the photoexcited material located closer to a second side of the separation section emit light of different colors.

13. An electronic apparatus including a display unit, the display unit comprising:
a pixel drive circuit including a driving transistor and a writing transistor;
a plurality of organic light-emitting devices respectively including a first electrode, an organic light-emitting layer, and a common second electrode; and
a separation section disposed between any adjacent two of the plurality of organic light-emitting devices and including a photoexcited material,
wherein the separation section is disposed between a respective first electrode and the common second electrode.

14. A method of manufacturing a display unit, the method comprising
  forming a pixel drive circuit including a driving transistor and a writing transistor; and
  forming a separation section between any adjacent two of a plurality of organic light-emitting devices which respectively include a first electrode, an organic light-emitting layer, and a common second electrode, the separation section being formed through including a photoexcited material, and the separation section being disposed between a respective first electrode and the common second electrode.

15. An illumination unit comprising:
  a pixel drive circuit including a driving transistor and a writing transistor;
  a plurality of organic light-emitting devices respectively including a first electrode, an organic light-emitting layer, and a common second electrode; and
  a separation section disposed between any adjacent two of the plurality of organic light-emitting devices and including a photoexcited material,
  wherein the separation section is disposed between a respective first electrode and the common second electrode.

16. A light-emitting device comprising: a pixel drive circuit including a driving transistor and a writing transistor; an organic excitation light source; a wavelength conversion layer converting excitation light emitted from the organic excitation light source into light of a wavelength different from a wavelength of the excitation light; and
  a wavelength selection film disposed directly on a surface of the wavelength conversion layer which is farther from the organic excitation light source.

17. The light-emitting device according to claim 16, wherein the wavelength selection film reflects light having a wavelength substantially equal to the wavelength of the excitation light and allows light having a wavelength different from the wavelength of the excitation light to pass therethrough.

18. The light-emitting device according to claim 16, wherein the wavelength conversion layer includes inorganic nanocrystal.

19. A method of manufacturing a light-emitting device, the method comprising:
  forming a pixel drive circuit including a driving transistor and a writing transistor; forming an organic excitation light source; forming, on the organic excitation light source, a wavelength conversion layer converting excitation light emitted from the organic excitation light source into light of a wavelength different from a wavelength of the excitation light; and
  forming a wavelength selection film directly on a surface of the wavelength conversion layer which is farther from the organic excitation light source.

* * * * *